(12) United States Patent
Takada et al.

(10) Patent No.: US 6,545,337 B2
(45) Date of Patent: Apr. 8, 2003

(54) SEMICONDUCTOR INTEGRATED CIRCUIT DEVICE

(75) Inventors: Tadayoshi Takada, Saitama (JP); Osamu Kitamura, Gunma (JP); Shigeaki Okawa, Tochigi (JP); Hirotsugu Hata, Gunma (JP); Chikao Fujinuma, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/946,216

(22) Filed: Sep. 5, 2001

(65) Prior Publication Data

US 2002/0028561 A1 Mar. 7, 2002

(30) Foreign Application Priority Data

Sep. 7, 2000 (JP) ........................................ 2000-271380
Sep. 7, 2000 (JP) ........................................ 2000-271382

(51) Int. Cl.⁷ .............................................. H01L 29/00
(52) U.S. Cl. .................... 257/499; 257/505; 257/525
(58) Field of Search ................... 438/322, 340, 438/341, 360, 361, 363, 412, 413, 424, 429, 430; 257/505, 511, 517, 518, 525, 526, 524, 565, 499

(56) References Cited

U.S. PATENT DOCUMENTS

| | | | | |
|---|---|---|---|---|
| 3,818,583 A | * | 6/1974 | Polata | 438/322 |
| 4,299,024 A | * | 11/1981 | Piotrowski | 438/203 |
| 4,393,573 A | * | 7/1983 | Kato et al. | 257/525 |
| 4,624,047 A | * | 11/1986 | Tani | 148/DIG. 135 |
| 5,065,219 A | * | 11/1991 | Terashima | 257/524 |
| 5,100,814 A | * | 3/1992 | Yamaguchi et al. | 438/234 |
| 5,841,169 A | * | 11/1998 | Beasom | 257/355 |

FOREIGN PATENT DOCUMENTS

JP  11-354535  12/1999

* cited by examiner

Primary Examiner—Tuan H. Nguyen
(74) Attorney, Agent, or Firm—Fish & Richardson PC

(57) ABSTRACT

Collector regions (32, 33) with films capable of withstanding high voltage by laminating 4 epitaxial layers when the collector regions (32, 33) are formed. In order to reduce effects caused by interference between the transistors (21, 22) and also reduce parasitic transistor, the epitaxial layers and substrate are etched in a V-groove. Each etched region is dielectrically isolated by the poly-Si (42).

12 Claims, 16 Drawing Sheets

SEMICONDUCTOR INTEGRATED CIRCUIT DEVICE

BACKGROUND OF THE INVENTION

This invention relates to a semiconductor integrated circuit device which realizes a high withstand voltage in a dielectric-isolated complementary bipolar transistor by provision of a thickened collector region, and a method of manufacturing the same.

In recent years, a high withstand voltage and a high-degree of integration of transistors used in an audio amplifier, a display driver, etc. have been demanded. High degree of integration and high speed of a high withstand voltage (or high voltage) integrated circuit is preferably realized by the dielectric isolation technique in order to prevent a parasitic transistor from being formed and prevents a chip size from being increased owing to element isolation.

FIG. 29 shows a sectional view of a conventional typical semiconductor integrated circuit device (e.g. Japanese Patent Publication No. 11-354535). Now referring to FIGS. 30–36, an explanation will be given of a method for manufacturing the semiconductor integrated circuit device shown in FIG. 29.

FIG. 30 shows an area where a high voltage vertical NPN vertical transistor is to be formed and another area where a high voltage vertical PNP transistor is to be formed. First, a buried oxide film 2 having a thickness of about 2 $\mu$m is formed on the surface of an N type substrate 3 of Si by thermal oxidation. The N type substrate is bonded to a supporting substrate 1 through the buried oxide film 2 at room temperature. The N type substrate 3 will be changed into an N+ type buried layer 4 and a P+ type buried layer 5, which are active layers, by the subsequent step. The N type substrate 3 may be a silicon substrate having e.g. resistivity of about 10 $\Omega$·cm. Thereafter, the substrate 3 is annealed in an atmosphere of oxygen e.g. for about two hours at 1000° C. to increase the bonding strength between the buried oxide film 2 and supporting substrate 1. Further, the thickness of the N type substrate 3 is reduced to a prescribed thickness, e.g. 2 $\mu$m by e.g. mechanical polishing or chemical-mechanical polishing (CMP).

Next, ion implantation is executed in order to form an N+ buried layer 4. Specifically, by known photolithography, using as a mask photoresist (not shown) with an opening at an NPN transistor section, N type impurities of e.g. arsenic (As) are ion-implanted at an accelerating voltage of 50 keV and dose of $3\times10^{15}/cm^2$. Thereafter, the photoresist is removed. Further ion-implantation is executed to form a P+ type buried layer 5. Specifically, by known photolithography, using as a mask photoresist (not shown) with an opening at a PNP transistor section, P type impurities of e.g. boron (B) are ion-implanted at an accelerating voltage of 50 keV and dose of $3\times10^{15}/cm^2$. Thereafter, the photoresist is removed.

Subsequently, the substrate is annealed in an atmosphere of water vapor e.g. for about one hour at 1100° C. so that the arsenic introduced in the NPN transistor section and boron introduced in the PNP transistor section in the previous step are thermally diffused, respectively, thereby forming the N+ type buried layer 4 and the P+ type buried layer 5. In this annealing step, an oxide layer (not shown) is formed on the surface of the active layer. So, this oxide layer is removed by light etching using e.g. a hydrofluoric acid solution, which results in a structure as shown in FIG. 30.

Next, as shown in FIG. 31, an N type epitaxial layer 6 having resistively of 10 $\Omega$·cm and a film thickness of 15 $\mu$m is grown on the N+ type buried layer 4 and the P+ type buried layer 5 which are the active layers. The NPN transistor section of the N type epitaxial layer 6 constitutes an N type collector region 7, whereas the PNP transistor section of the N type epitaxial layer 6 is changed into a P type collector region 8 by the subsequent step. Specifically, an oxide film 9 having a thickness of 50 nm is formed by thermal oxidation. By known photolithography, using as a mask photoresist with an opening at a PNP transistor section, P type impurities of e.g. boron (B) are ion-implanted at an accelerating voltage of 300 keV and dose of $8\times10^{12}/cm^2$. The substrate is annealed in an atmosphere of inert gas for e.g. 7 (seven) hours at 1200° C. to form the P type collector region 8 of the PNP transistor, which results in a structure as shown in FIG. 31.

By known photolithography, using as a mask photoresist with an opening on a base portion of the NPN transistor, P type impurities of e.g. boron (B) are ion-implanted at an accelerating voltage of 40 keV and dose of $1\times10^{14}/cm^2$. After the photoresist has been removed, by known photolithography, using as a mask photoresist with an opening on a base region of the PNP transistor, N type impurities of e.g. phosphorous (P) are ion-implanted at an accelerating voltage of 60 keV and dose of $1\times10^{14}/cm^2$. After the photoresist has been removed, the substrate is annealed in an atmosphere of inert gas for e.g. 30 minutes at 900° C. As a result, the impurities are thermally diffused to form a P type base region 10 of the NPN transistor and an N type base region 11 of the NPN transistor, respectively.

Next, by known photolithography, using as a mask photoresist with openings on an N type emitter region and an N type collector contact of the NPN transistor, N type impurities of e.g. arsenic (As) are ion-implanted at an accelerating voltage of 110 keV and dose of $5\times10^{15}/cm^2$. Thereafter, the photoresist is removed. Subsequently, by known photolithography, using as a mask photoresist with openings on a P type emitter region and a P type collector contact of the PNP transistor, P type impurities of e.g. boron (B) are ion-implanted at an accelerating voltage of 40 keV and dose of $3\times10^{15}/cm^2$. After the photoresist has been removed, the substrate is annealed in an atmosphere of inert gas for e.g. about 30 minutes at 1000° C. As a result, the impurities are thermally diffused to form an N+ type emitter region 12 and an N+ type collector contact 13 of the NPN transistor, and a P+ type emitter region 14 and P+ type collector contact 15 of the PNP transistor, respectively. Thus, the structure as shown in FIG. 32 results.

Thereafter, the oxide layer 9, N type collector layer 7 and N+ type buried layer 4 of the NPN transistor section are etched to reach the buried oxide layer 2, thereby forming a trench 16 for element isolation. Simultaneously, the oxide layer 9, P type collector layer 8 and P type buried layer 5 of the PNP transistor section are etched to reach the buried oxide layer 2, thereby forming a trench 16 for element isolation. The trenches 16 are formed so that the sides of the collector contacts 13 and 15 are exposed within the trenches 16, respectively. Thus, the structure as shown in FIG. 33 results.

Next, by e.g. thermal oxidation, an oxide film 17 having a thickness of about 500 nm is formed on the inner wall of the trench 16. Further, the oxide film 17 abutting on the collector contacts 13 and 15 of the NPN transistor and PNP transistor is removed by etching. Thus, the structure as shown in FIG. 34 results. By e.g. Chemical Vapor Deposition (CVD), poly-Si 18 is deposited to be buried within the trench 16 with the oxide film 17. Thereafter, the poly-Si 18 which has overflowed is etched back by Reactive Ion Etching (RIE) to flatten the substrate surface. Thus, the structure as shown in FIG. 35 results.

N type impurities are implanted into the poly-Si 18 buried in the trench 16 which abuts on the N$^+$ type collector contact 13 of the NPN transistor. Specifically, by known photolithography, using as a mask photoresist with an opening at the trench, N type impurities of e.g. phosphorous (P) are ion-implanted at an accelerating voltage 180 keV and dose of $5 \times 10^{15}/cm^2$. Further, P type impurities are introduced into the poly-Si 18 buried in the trench 16 which abuts on the P$^+$ type collector contact 15 of the PNP transistor. Specifically, by known photolithography, using as a mask photoresist with an opening at the trench, P type impurities of e.g. boron (B) are ion-implanted at an accelerating voltage of 180 keV and dose of $5 \times 10^{15}/cm^2$.

Subsequently, the substrate is annealed in an atmosphere of inert gas for e.g. about 30 minutes at 1000° C. As a result, the phosphorous (P) is thermally diffused from the trench of the NPN transistor, thereby forming an N$^+$ type diffused layer 18n which connects the N$^+$ type buried layer 4 and the N$^+$ type collector contact 13. Simultaneously, boron (B) is thermally diffused from the trench of the PNP transistor, thereby forming a P$^+$ type diffused layer 18p which connects the P$^+$ buried layer 5 and the P$^+$ type collector contact 15. Specifically, since the speed of diffusing the impurities in poly-Si is several tens of times as high as that in monocrystal Si, the impurities are diffused from the poly-Si within the trench into the monocrystal Si (epitaxial layer) of the collector region in a short time. The impurities which have moved into the collector region are diffused at the same speed as that in the monocrystal Si and accumulated in a layer at the interface between the trench and the collector region, thereby forming N$^+$ type diffused layer 18n and the P$^+$type diffused layer 18p (collector walls). Thus, the structure as shown in FIG. 36 results.

Next, by e.g. CVD, an oxide film 19 is deposited on the entire surface of the substrate. Further, photoresist is deposited on the entire surface, and by known photolithography, openings are made at the positions where electrode are to be formed. Using the photoresist as a mask, by e.g. RIE, the openings are made in the oxide film 19 and the portions thereof where the electrodes are to be formed. By e.g. sputtering, aluminum (Al) 20 is deposited on the entire surface of the oxide film 19 with the openings at the portions where the electrodes are to be formed. Thereafter, photoresist is deposited on the entire surface of the aluminum 20, and by known photolithography, the photoresist is removed at the other portions than the portions where the electrodes are to be formed. Using the remaining photoresist as a mask, by e.g. RIE, the aluminum 20 is patterned. By removing the photoresist after the electrodes have been formed, the semiconductor device whose section is shown in FIG. 29 results.

In the semiconductor device having the structure as described above, the NPN transistor and PNP transistor which are adjacent to each other are electrically isolated by the dielectric isolation technique. Thus the degree of integration is enhanced, and the parasitic capacitance of the PN junction in each transistor can be reduced. This contribute to the high speed operation of the device. Further, in the semiconductor device having the structure as described above, the base-collector withstand voltage is assured by reducing the impurity concentration in the collector region 7, 8. However, reduction in the impurity concentration in the entire collector regions 7, 8 increases the series resistance of the collector, thus deteriorating the characteristic. In order to obviate such an inconvenience, under the lightly doped collector regions 7 and 8, the collector walls (N$^+$ diffused layer 18n, P$^+$ diffused layer 18p) are formed which connect the highly doped buried layers 4, 5 and the collector contacts 13, 15, respectively. In this way, the high with stand voltage of the bipolar transistor can be realized while the high speed operation which is a benefit of the bipolar transistor is utilized.

In the conventional semiconductor integrated circuit device, the lightly-doped collector regions 7 and 8, i.e. N type epitaxial layer 6 must be formed be thick in order to realize a high withstand voltage. In this case, in order to diffuse impurities from the surface of the N type epitaxial layer 6, heat treatment for a long time at a high temperature is required so that making the thick film of the collector regions has a limitation in process. Therefore, the film thickness of the collector regions formed of a single epitaxial layer has a limitation to realize the high withstand voltage. Accordingly, the conventional semiconductor integrated circuit could not provide a necessary withstand voltage.

In the conventional method of manufacturing a semiconductor integrated circuit device, in order to realize a dielectric-isolated complementary transistor pair composed of an NPN transistor and a vertical PNP transistor which are formed to be adjacent to each other on a single chip, a trench was used to isolate both transistors from each other. However, the trench has a limitation in depth and imperfection in an etching accuracy. Therefore, the conventional method has a problem that the etching for element isolation, attended with the thick film of the epitaxial layer for realizing the high withstand voltage, is difficult.

Where the lightly-doped collector regions 7 and 8, i.e. N type epitaxial layer 6 are made thick in order to realize the high withstand voltage, the lightly-doped collector region 8 of the vertical PNP transistor must be formed in such a manner that the ion-implanted impurities are heat treated for a long time at a high temperature. Therefore, the formation of the thick film of the N type epitaxial layer has a limitation in process, and increase the production cost. Further, ion-implanting at a high accelerating voltage and high dose for the purpose of increasing the depth of the impurity diffusion disadvantageously makes the crystal defect of the Si substrate remarkable.

Where photoresist is deposited on the collector region and dummy island region etched in a V groove and isolated from each other by known photolithography employed in a self-alignment step, it was difficult to deposit the photoresist on the corners of these collector region and dummy island.

SUMMARY OF THE INVENTION

This invention has been accomplished in view of the conventional problem as described above. The semiconductor integrated circuit device according to this invention is characterized by comprising: a supporting substrate; a polycrystalline semiconductor layer formed on the supporting substrate; a first island region which is formed of a buried layer of a lightly-doped impurity diffused layer having one conduction type; a second island region which is formed of a buried layer of a lightly-doped impurity diffused layer having an opposite conduction type, the first island region and the second island region being separated from each other by the polycrystalline semiconductor layer; a first buried layer of a highly-doped impurity diffused layer having the one conduction type which is formed on the periphery of the first island region adjacent to the polycrystalline semiconductor layer; a second buried layer of a highly-doped impurity diffused layer having the opposite conduction type which is formed on the periphery of the second island region; transistors having different conduction types which are formed in the first and the second island region, and in that the surfaces of the polycrystalline semiconductor layer and the first and second island regions are made substantially flat.

In the semiconductor integrated circuit device according to this invention, preferably, the first and the second island region are composed of a plurality of epitaxial layers, respectively so that the first and the second island region can be formed in a thick film, thereby realizing high withstand voltage transistors.

In order to attain the above object, a method of manufacturing a semiconductor integrated circuit device according to this invention comprises the steps of: preparing a semiconductor substrate having one conduction type; forming plural epitaxial layers having an opposite conduction type on the substrate, and forming buried layers having the one conduction type and the opposite conduction type in the substrate and the epitaxial layers which are diffused and coupled, thereby forming a first and a second island region; etching both ends of each of the first and the second island region in a V-groove; implanting ions into the surfaces of the first and the second island region so that a first buried layer of a highly-doped impurity diffused layer having the one conduction type is formed in the first island region and a second buried layer of a highly-doped impurity diffused layer having the opposite conduction type is formed in the second island region; forming a LOCOS oxide film on the surface of the first buried layer, and forming an oxide film on the surface of the second buried layer and a polycrystalline semiconductor layer on the LOCOS oxide film and the oxide film; preparing a supporting substrate covered with an oxide film and bonding the supporting substrate to the polycrystalline semiconductor layer through the oxide film; and polishing the semiconductor substrate with the supporting substrate located down until the first and the second island region are exposed.

In the method of manufacturing a semiconductor integrated circuit device according to this invention, preferably, the step of etching the first and the second island region is to remove the entire interface between the buried layers of lightly-doped diffused layers constituting the first and the second island region and the epitaxial layers to reach the bottom of the first and the island region formed to have a thick film in a V-groove to realize dielectric-isolated complementary bipolar transistors.

In the method of manufacturing the semiconductor integrated circuit device according to this invention, ion-implanting is done in the surface of the epitaxial layer so that occurrence of crystal defects in the substrate can be reduced obviously as compared with the case where ion-implanting is done in the substrate surface to form a diffused layer for extending a collector.

In order to attain the above object, the method of manufacturing a semiconductor integrated circuit device according to this invention comprises the steps of: preparing a semiconductor substrate having one conduction type; forming plural epitaxial layers having an opposite conduction type on the substrate, and forming buried layers having the one conduction type and the opposite conduction type in the substrate and the epitaxial layers which are diffused and coupled, thereby forming a first and a second island region; etching both ends of each of the first and the second island region in a V-groove to form a dummy island the first and the second island region; forming an uniform oxide film on the first island region, the second island region and the dummy island region; forming an uniform oxidation-resistant mask layer on the first island region, the second island region and the dummy region; ion-implanting highly-doped impurities having the one conduction type from above the oxide film on the first island region using as a mask the oxidation-resistant mask layer selectively left on the second is land region and the dummy island region; diffusing the highly-doped impurities having the one conduction type and also selectively oxidizing the surface to form a LOCOS oxide film; removing the oxidation mask layer on the second island region, and using the LOCOS oxide film as a mask on the island region, ion-implanting highly-doped impurities having the opposite conduction type from above the oxide film on the second island region; and diffusing the highly-doped impurities having the opposite conduction type.

In the method of manufacturing a semiconductor integrated circuit device according to this invention, preferably, an interface between the highly-doped impurities having the one conduction type and opposite conduction type is formed on the dummy island region so that unnecessary formation of the highly-doped impurities in the first and the second island region, thereby suppressing the electrical influence to the maximum.

The method of manufacturing a semiconductor integrated circuit device according to this invention comprises the steps of: preparing a semiconductor substrate having one conduction type; forming plural epitaxial layers having an opposite conduction type on the substrate, and forming buried layers having the one conduction type and the opposite conduction type in the substrate and the epitaxial layers which are diffused and coupled, thereby forming a first and a second island region; etching both ends of each of the first and the second island region in a V-groove; removing the corner of each of the first and the second island region; implanting ions into the surface of the first and the second island region so that a first buried layer of a highly-doped impurity diffused layer having the one conduction type is formed in the first island region and a second buried layer of a highly-doped impurity diffused layer having the opposite conduction type is formed in the second island region; forming a LOCOS oxide film on the surface of each of the first buried layer and the second buried layer and a polycrystalline semiconductor layer on the LOCOS oxide film; forming an oxide film on the polycrystalline semiconductor layer and bonding a supporting substrate to the polycrystalline semiconductor layer; polishing the semiconductor substrate with the supporting substrate located down until the first and the second island region are exposed.

In the method of manufacturing a semiconductor integrated circuit device, the step of removing the corner of each of the first and the second island region is to deposit photoresist on the other area than the corner of each of the first and the second island region and to make etching using the photoresist as a mask so that the photoresist can be deposited easily and accurately.

DETAILED DESCRIPTION OF THE PREFERRED EMBODIMENT

Figure 1:
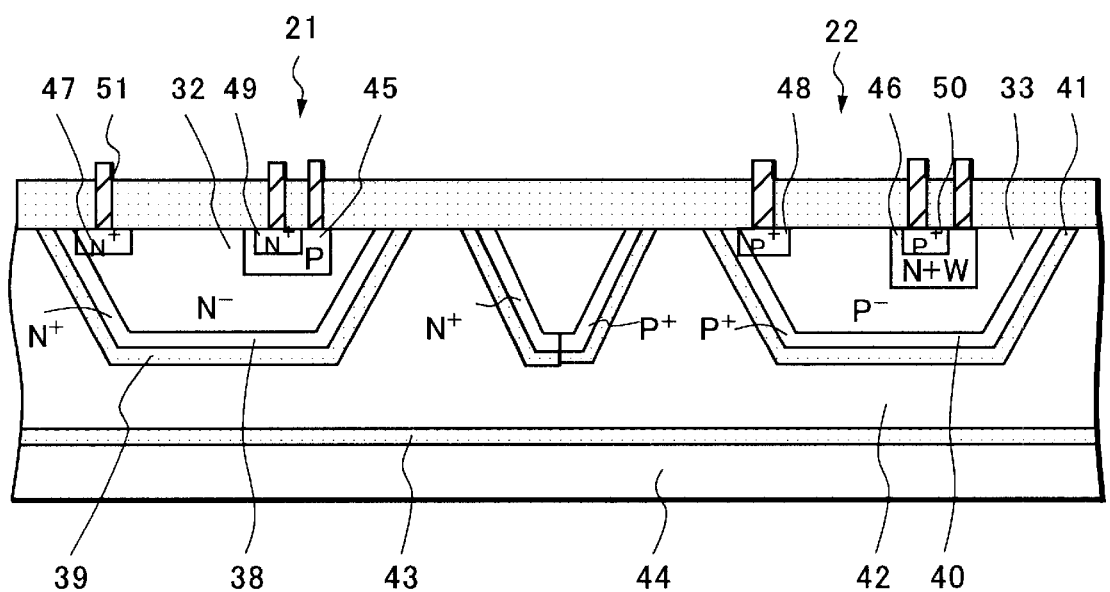
FIG. 1 is a sectional view for explaining a semiconductor integrated circuit device according to a first embodiment of this invention.

Now referring to the drawings, a detailed explanation will be given of a first and a second embodiment of a semiconductor integrated circuit according to this invention and a method of manufacturing the same.

First, the first embodiment will be explained below referring to FIGS. 1 to 14.

FIG. 1 is a sectional view of a first embodiment of an IC according to this invention in which a high voltage NPN transistor 21 and a high voltage vertical PNP transistor 22 are formed through poly-Si 42 as dielectric-isolated complementary bipolar transistors.

In the semiconductor integrated circuit device according to this invention, poly-Si 42 is formed on a supporting substrate 44 covered with a silicon oxide film 43. The supporting substrate 44 is bonded to the poly-Si 42 through the silicon oxide film 43 by heat treatment for about two hours at 1100° C.–1200° C. The dielectric-isolated complementary bipolar transistors are formed through the poly-Si 42.

In the high voltage NPN transistor 21, a silicon oxide film 39 and a $N^+$ type buried layer 38 are formed to surround a collector 32. The collector region 32 includes an $N^+$ type diffused region 47 serving as a collector taking-out region, a P type diffused region 45 serving as a base region and an N⁺ type diffused layer 49 serving as an emitter region. In this case, the collector taking-out region 47, which is coupled with the N⁺ buried region 38, constitutes an N⁺ highly doped layer, thus realizing a structure with a reduced collector resistance of the high voltage NPN transistor 21.

In the high voltage vertical PNP transistor 22, a silicon oxide film 41 and a P⁺ buried layer 40 are formed to surround a collector region 33. The collector region 33 includes a P⁺ type region 48 serving as a collector taking-out region, an N⁺ type well region 46 serving as a base region and a P⁺ type diffused region 50 serving as an emitter region. In this case, the collector taking-out region 48, which is coupled with the P⁺ buried region 40, constitutes a P⁺ highly doped layer, thus realizing a structure with a reduced collector resistance of the high voltage PNP transistor 22.

Although not shown, where these transistors are formed integrally to other peripheral circuits in a monolithic circuit, electrode wirings of Al, interlayer insulating film of polyimide insulating film and a polyimide jacket coating, etc. are formed on these elements.

In the semiconductor integrated circuit device, the N⁺ type and P⁺ type buried layers 38 and 40, which are formed on the periphery of the N⁻ type and P⁻ type collector regions 32 and 33, respectively, are coupled with the collector taking-out regions 47 and 48, respectively. This provides the N⁺ type and P⁺ type highly-doped layers to reduce the collector resistance so that the collector regions 32 and 33 can be made thick. Thus, the high voltage complementary bipolar transistors can be formed.

Figure 14:
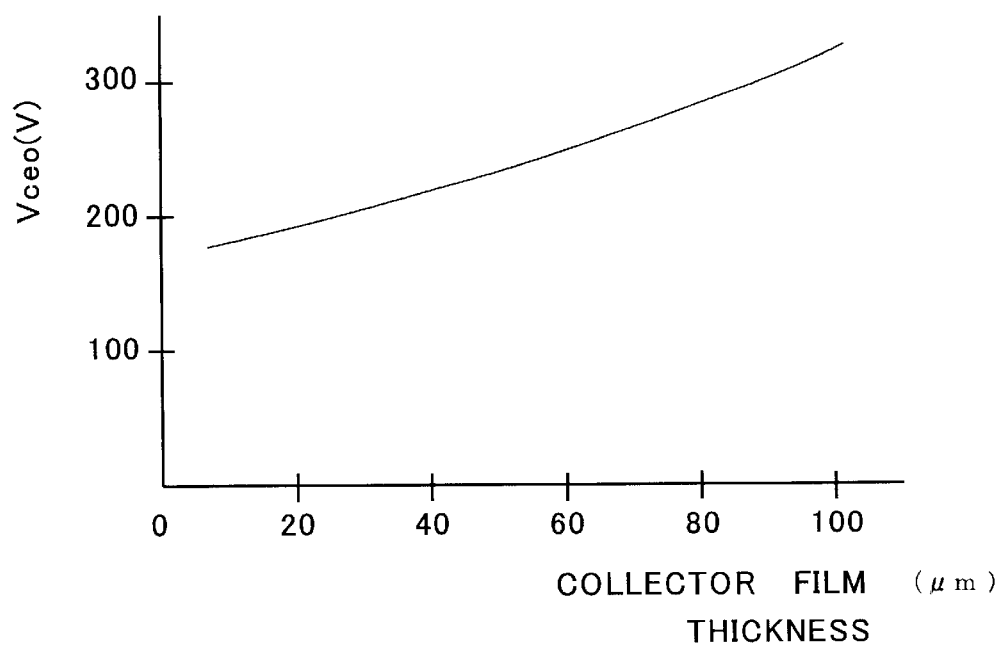
FIG. 14 is a graph showing the relationship between the film thickness and withstand voltage in complementary transistors dielectric-isolated in the semiconductor integrated circuit device in the first and the second embodiment of this invention.

Concretely, FIG. 14 shows a relationship between a collector region film thickness and a withstand voltage in the dielectric-isolated complementary transistors in the semiconductor integrated circuit device according to this invention. As understood from the characteristic graph of FIG. 14, with the film thickness of the collector region of 90 $\mu$m, the collector-emitter withstand voltage of 300 V can be obtained so that the high voltage complementary bipolar transistors can be formed. In order to obtain the collector-emitter voltage $V_{ceo}$ of 250 V or higher, the film thickness of about 60 $\mu$m or larger is required. This film thickness far exceeds the limitation in the manufacturing method using a trench.

In the semiconductor integrated circuit device according to this invention, as described above, the NPN transistor 21 and PNP transistor 22 are surely dielectric-isolated through the poly-Si 42. For this reason, influence of the transistors 21 and 22 from each other and creation of the parasitic transistor can be suppressed so that the semiconductor integrated circuit device is more suitable for a high frequency operation.

Further, a P type monocrystal Si substrate 23 of a crystal axis of (100) has a resistivity of 50 $\Omega$·cm or more. An epitaxial layer is stacked on the substrate 23 to form an area where transistors are to be formed. In this invention, multiple epitaxial layers are stacked. In this case, the substrate 23 is placed at a high temperature for a long time. For example, where four epitaxial layers are stacked, the substrate is placed at about 1000–1400° C. for 24 hours. In view of this, as described above, the substrate having low resistivity is used, the creep from the substrate 23 can be suppressed. Accordingly, the epitaxial layer which is used as the collector regions 32 and 33 can be made thick, thereby permitting a high voltage transistor to be realized.

Now referring to FIGS. 2 to 13, an explanation will be given of the method of manufacturing the semiconductor integrated circuit device as shown in FIG. 1.

Figure 2:
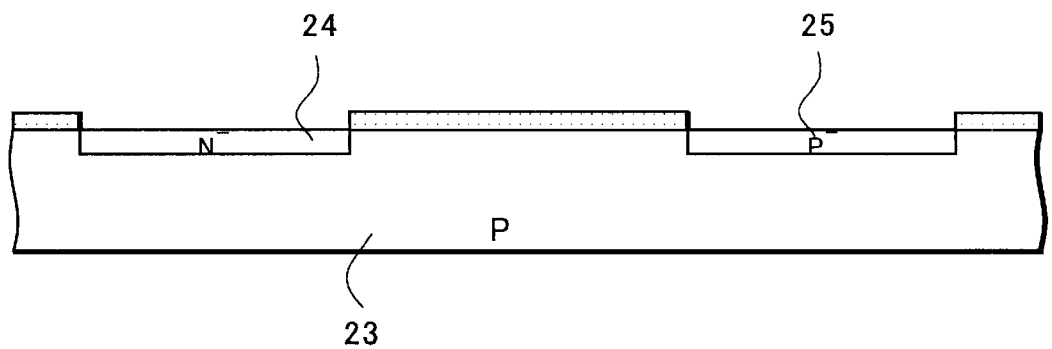
FIG. 2 is a sectional view for explaining a method of manufacturing the semiconductor integrated circuit device according to the first embodiment of this invention.

First, as seen from FIG. 2, a P type monocrystal Si substrate 23 having a thickness of about 650 $\mu$m is prepared. The surface of the substrate 23 is thermally oxidized to form an oxide film. The oxide film is photo-etched to provide a selective mask. Phosphorous (P) which forms an N⁻ type first buried layer 24 and boron (B) which forms a P⁻ type first buried layer 25 are ion-implanted and diffused in the surface of the substrate 23.

Figure 3:
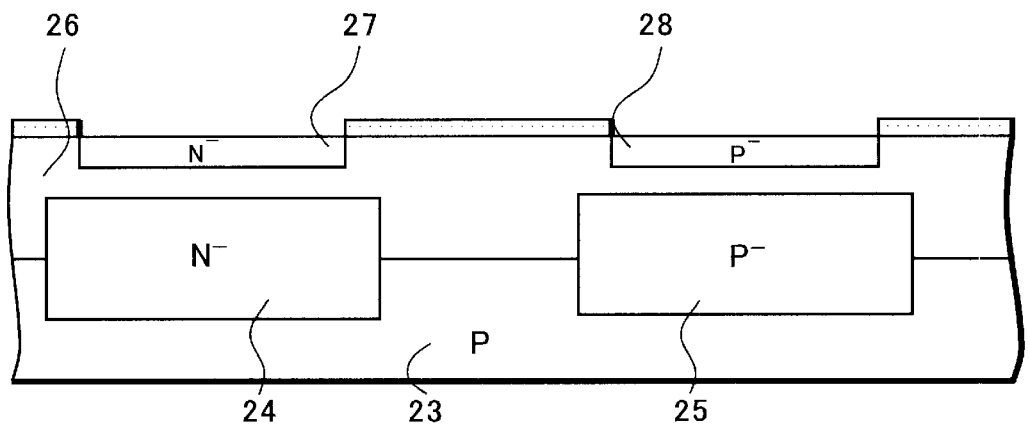
FIG. 3 is a sectional view for explaining a method of manufacturing the semiconductor integrated circuit device according to the first embodiment of this invention.

Next, as shown in FIG. 3, after the oxide film used as the selective film has been entirely removed, the substrate 23 placed on a susceptor of an epitaxial growth apparatus is subjected to a high temperature of about 1140° C. by lamp heating, and $SiH_2Cl_2$ gas and $H_2$ gas are introduced into a reactive tube. An N or N⁻ first epitaxial layer 26 having a thickness of 18–22 $\mu$m is grown. The surface of the first epitaxial layer 26 is thermally oxidized to form an oxide film. The oxide film is photo-etched to provide a selective film. Phosphorous (P) which forms an N⁻ type second buried layer 27 and boron (B) which forms a P⁻ type second buried layer 28 are ion-implanted and diffused in the surface of the first epitaxial layer 26.

Figure 4:
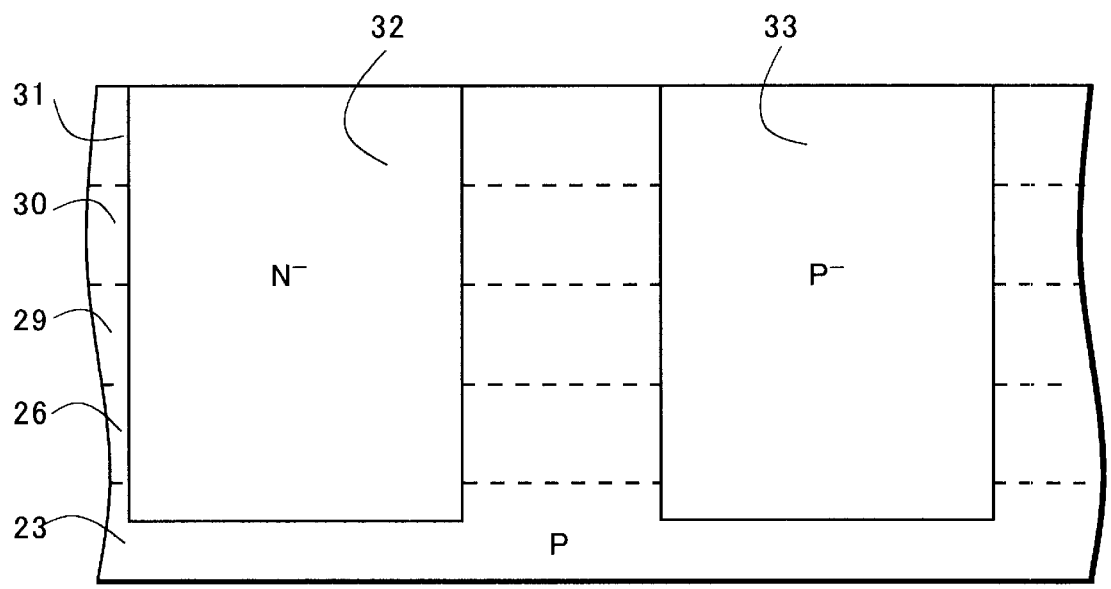
FIG. 4 is a sectional view for explaining a method of manufacturing the semiconductor integrated circuit device according to the first embodiment of this invention.

Next, as shown in FIG. 4, after the oxide film used as the selective film has been entirely removed, the substrate 23 placed on the susceptor of the epitaxial growth apparatus is subjected to a high temperature of about 1140° C. by lamp heating, and $SiH_2Cl_2$ gas and $H_2$ gas are introduced into a reactive tube. An N or N⁻ second epitaxial layer 29 having a thickness of 18–22 $\mu$m is grown. Simultaneously, the N⁻ type first and second buried layers 24 and 27 and the P⁻ type first and second buried layers 25 and 28 are coupled with each other by diffusion. After the second epitaxial layer 29 has been formed on the first epitaxial layer 26, a third epitaxial layer 30 and a fourth epitaxial layer 31 are successively formed. In this case, as described above, as regards each epitaxial layer, an N⁻ type buried layer and P⁻ type buried layer are formed by ion-implantation. These buried layers are coupled with each other by diffusion at a high temperature of 1250° C. for about 16 hours. As a result, an N⁻ type collector region 32 of an NPN transistor 21 and a P⁻ type collector region 33 of a PNP transistor 22 are formed.

Now it should be noted that phosphorous (P) is used as N type impurities and boron (B) is used as P type impurities because the impurities having a high diffusing speed assures the coupling the buried layers for a short heat treating time. Namely, this intends to form a flat profile in a short time in the N type impurity region and P type impurity region.

This invention is also characterized in that the regions where the NPN transistor 21 and PNP transistor 22 are to be formed can be formed simultaneously on the substrate 23.

Figure 5:
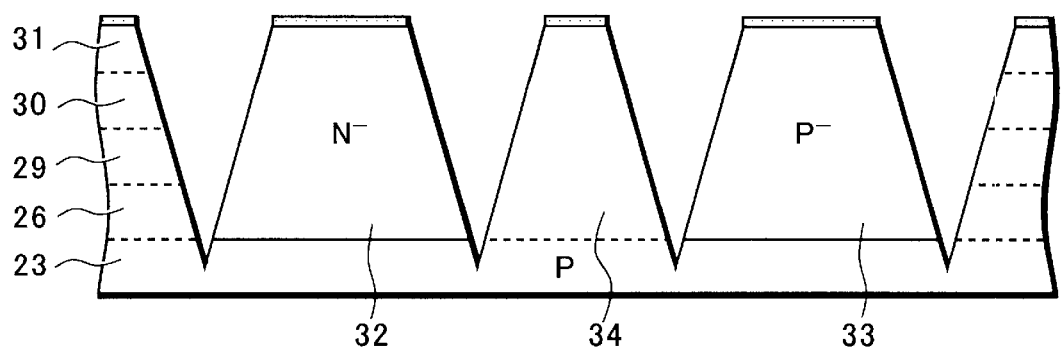
FIG. 5 is a sectional view for explaining a method of manufacturing the semiconductor integrated circuit device according to the first embodiment of this invention.

Next, as shown in FIG. 5, the surface of the fourth epitaxial layer 31 is thermally oxidized to provide an oxide film. The oxide film is photo-etched to form a selective mask. In this case, in order to reduce the interference between the NPN transistor 21 and the PNP transistor 22 formed adjacently in a single chip and suppress the creation of a parasitic transistor, element isolation must be made between the N⁻ type collector region 32 where the NPN transistor 21 is formed and the P⁻ type collector region 33 where the PNP transistor 22 is formed. In view of the known photolithography used in the subsequent self-alignment step, a dummy island region 34 is formed between the N⁻ type collector region 32 and P⁻ type collector region 33. The first epitaxial layer 26, second epitaxial layer 29, third epitaxial layer 30, fourth epitaxial layer 31 and the substrate 23 are etched more deep than the diffused depth of the N⁻ type first buried layer 24 and the P⁻ type first buried layer 25. Thus, V grooves for element isolation are formed.

Figure 6:
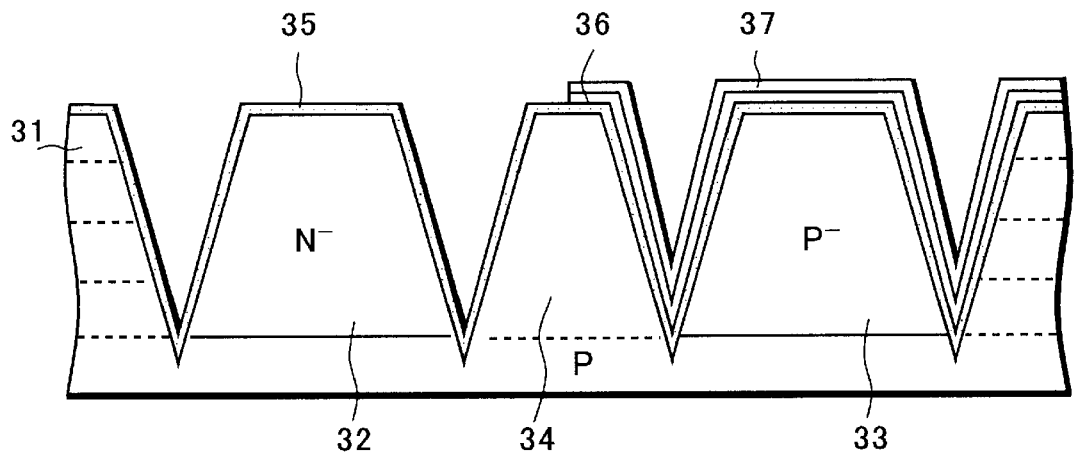
FIG. 6 is a sectional view for explaining a method of manufacturing the semiconductor integrated circuit device according to the first embodiment of this invention.

As shown in FIG. 6, after the oxide film used as a selective mask has been entirely removed, a silicon oxide film 35 having a thickness of 400–500 Å is deposited on the entire surface. Further, silicon nitride film 36 is deposited on the entire surface. In order to form an N+ type buried layer 38 on the surface of the N− type collector region 32, photoresist (not shown) is deposited on the entire surface. By known photolithography, with the silicon nitride film 36 and photoresist 37 on the P− type collector region 33 and dummy island 34 being left, the remaining silicon nitride film 36 and the photoresist 37 are removed.

Figure 7:
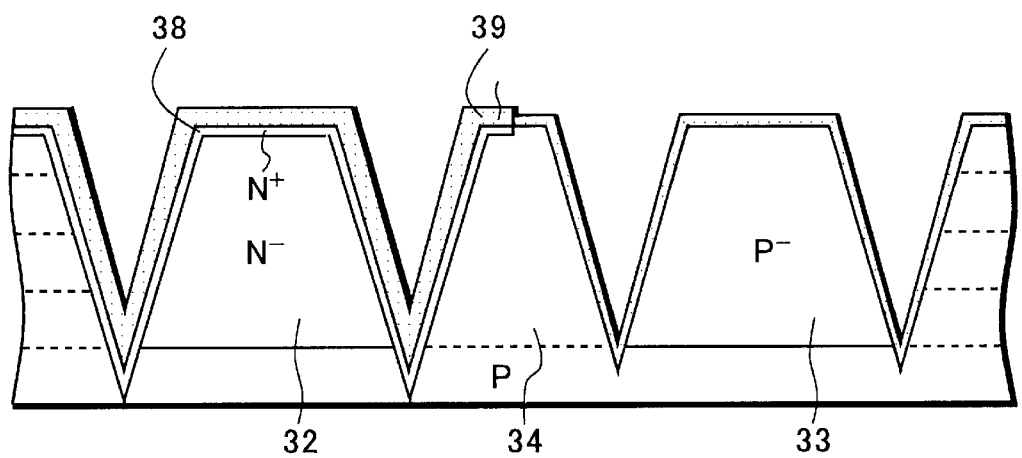
FIG. 7 is a sectional view for explaining a method of manufacturing the semiconductor integrated circuit device according to the first embodiment of this invention.

As shown in FIG. 7, in order to form the N+ type buried layer 38 on the periphery of the N− type collector region 32, using the patterned silicon nitride film 36 as a selective mask, arsenic (As) is ion-implanted at an accelerating voltage of 40 keV and dose of $3.0 \times 10^{15}/cm^2$. After the photoresist 37 has been removed, the ion-implanted arsenic is diffused so that the N+ type buried layer 38 is formed on the periphery of the N− type collector region 32. At this time, using the silicon nitride film 36 as an oxidation resistant mask, the silicon oxide film is also selectively oxidized to form a LOCOS oxide film 39 having a thickness of about 0.3–0.4 μm. Thereafter, the silicon nitride film 36 used as the selective film is entirely removed.

Figure 8:
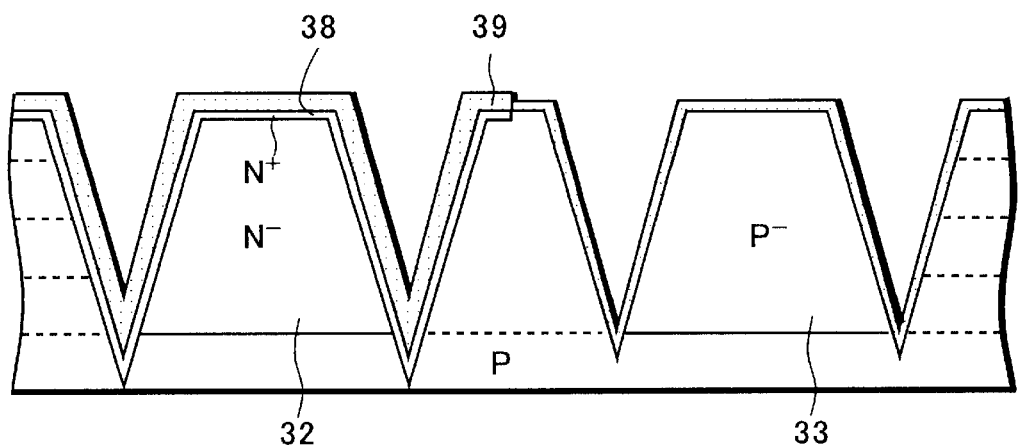
FIG. 8 is a sectional view for explaining a method of manufacturing the semiconductor integrated circuit device according to the first embodiment of this invention.

Next, as shown in FIG. 8, in order to a P+ type buried layer 40 on the periphery of the collector region of the P− type collector region 33, e.g. boron (B) is ion-implanted at an accelerating voltage of 40 keV and dose of $3.0 \times 10^{15}/cm^2$. In this case, because the LOCOS oxide film 39 serves as a mask, the boron is not ion-implanted in the N− type collector region 32.

Figure 9:
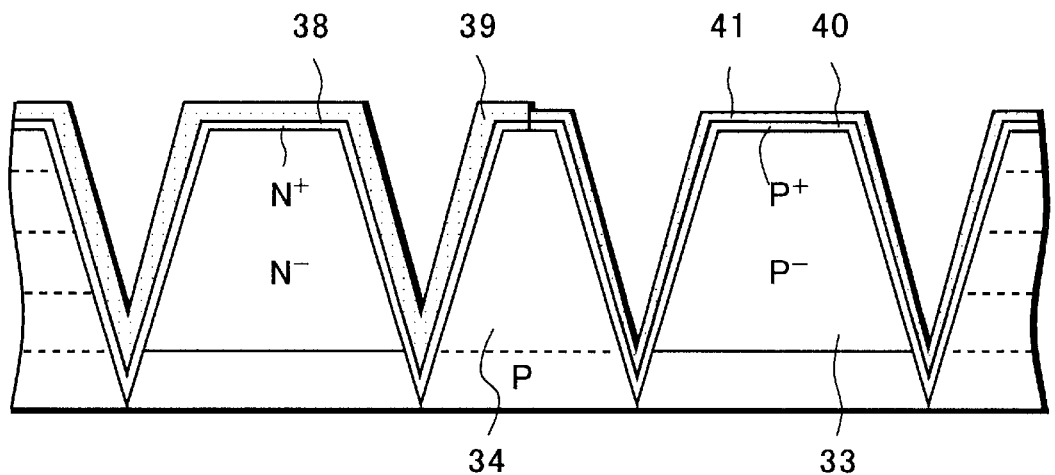
FIG. 9 is a sectional view for explaining a method of manufacturing the semiconductor integrated circuit device according to the first embodiment of this invention.

Next, as shown in FIG. 9, the ion-implanted boron (B) is diffused to form the P+ type buried layer 40 on the periphery of the P− type collector region 33. In this case, provision of the LOCOS oxide film is not required on the P− type collector region 33. Therefore, as seen, the LOCOS oxide film 39 and oxide film 41 remains as they constitute a level difference. The N+ type buried layer 38 and the P+ type buried layer 40 are brought into contact with each other on the dummy island region 34. However, since no semiconductor layer is formed on the dummy island region 34 and the NPN transistor 21 and the PNP transistor 22 are element-isolated, no problem is presented.

Figure 10:
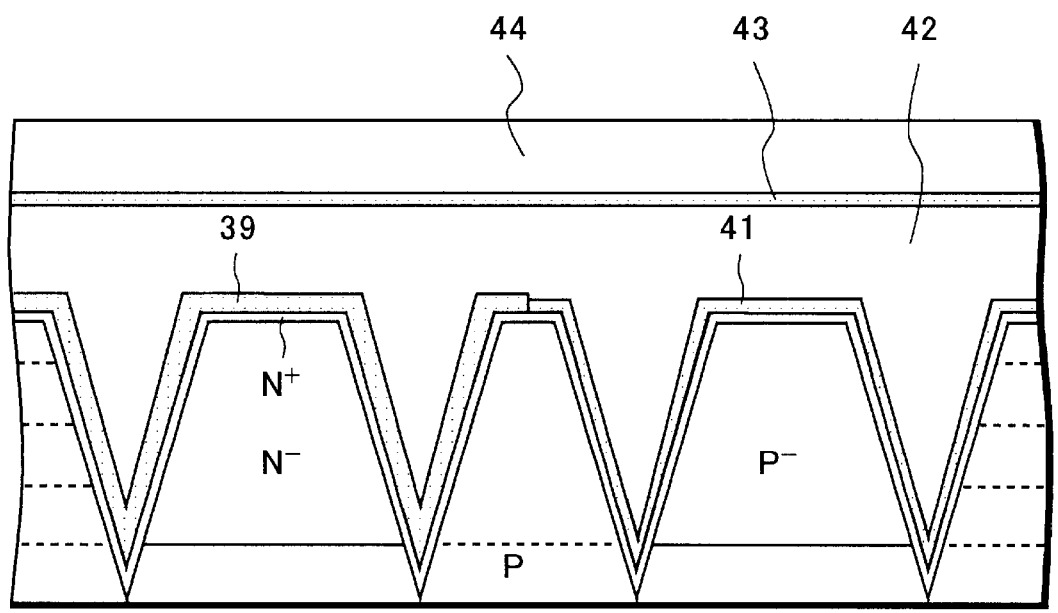
FIG. 10 is a sectional view for explaining a method of manufacturing the semiconductor integrated circuit device according to the first embodiment of this invention.

Next, as shown in FIG. 10, poly-Si 42 is deposited with CVD on the silicon oxide films 39 and 41 at a high temperature of 1240° C. for about one hour so that it has a thickness of about 150 μm. Thereafter, the poly-Si 42 is flattened by polishing so as to have a thickness of at least about 30 μm. A wafer covered with an oxide film 43 prepared separately, which serves as a supporting substrate 44, is bonded onto the surface of the poly-Si 42. The composite is heat-treated at a temperature of 1100–1200° C. for about two hours so that the supporting substrate 44 can be surely bonded to the surface of the poly-Si 42. Incidentally, it should be noted that the supporting substrate 44 may not particularly a conductive material as long as it can endure the subsequent polishing step.

Figure 11:
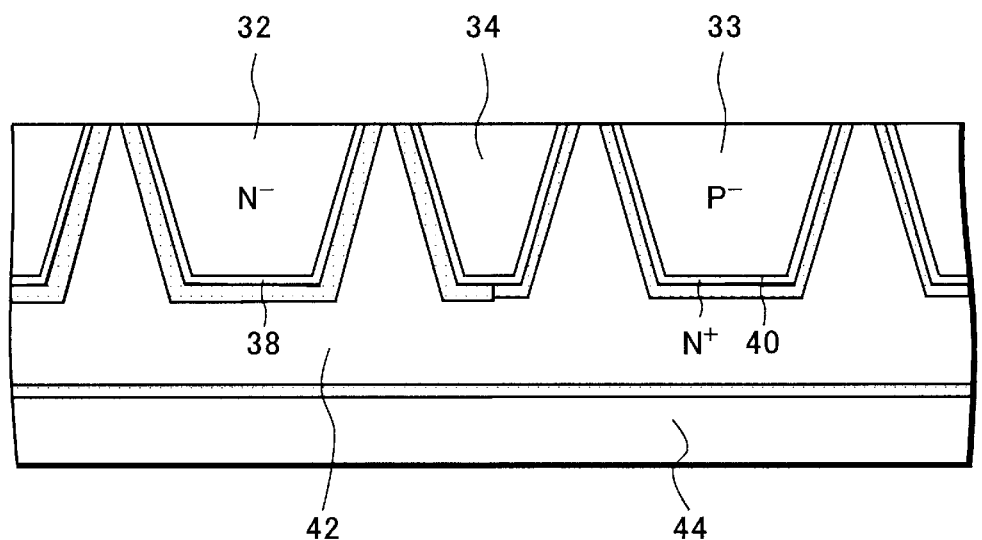
FIG. 11 is a sectional view for explaining a method of manufacturing the semiconductor integrated circuit device according to the first embodiment of this invention.

Next, as shown in FIG. 11, the substrate is turned upside down so that the monocrystal Si substrate 23 constitutes an upper surface and the supporting substrate 44 constitutes a bottom surface. The Si substrate 23 is polished by a thickness of about 580 μm from its surface until the N− type collector region 32 and the P− type collector region 33 are exposed. In this case, the N− type collector region 32, P− type collector region 33 and dummy island region 34 are separated from one another through the poly-Si 42. In this step, the N− type collector region 32 and P− type collector region 33 are formed to have a thickness of about 60–80 μm.

Figure 12:
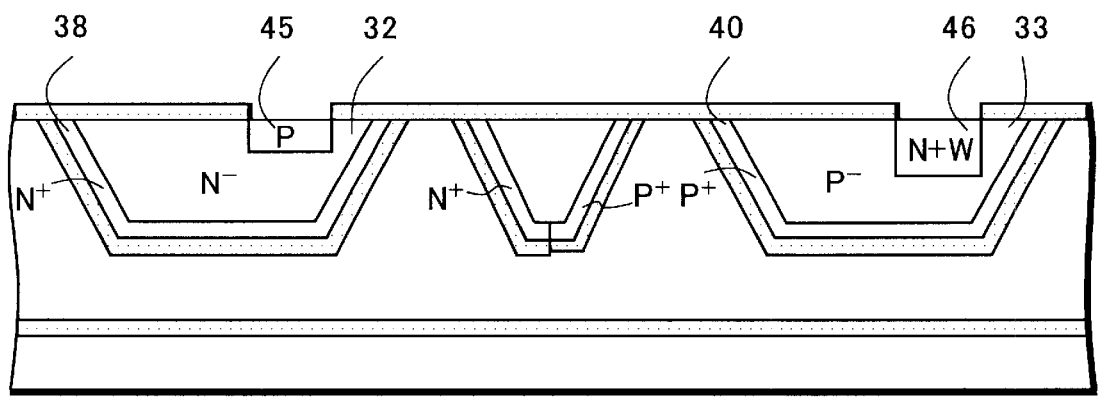
FIG. 12 is a sectional view for explaining a method of manufacturing the semiconductor integrated circuit device according to the first embodiment of this invention.

Next, as shown in FIG. 12, a P type diffused region 45 is formed as a base region in the N− type collector region 32, and a N+ type well region 46 is formed as a base region in the P− type collector region 33.

Figure 13:
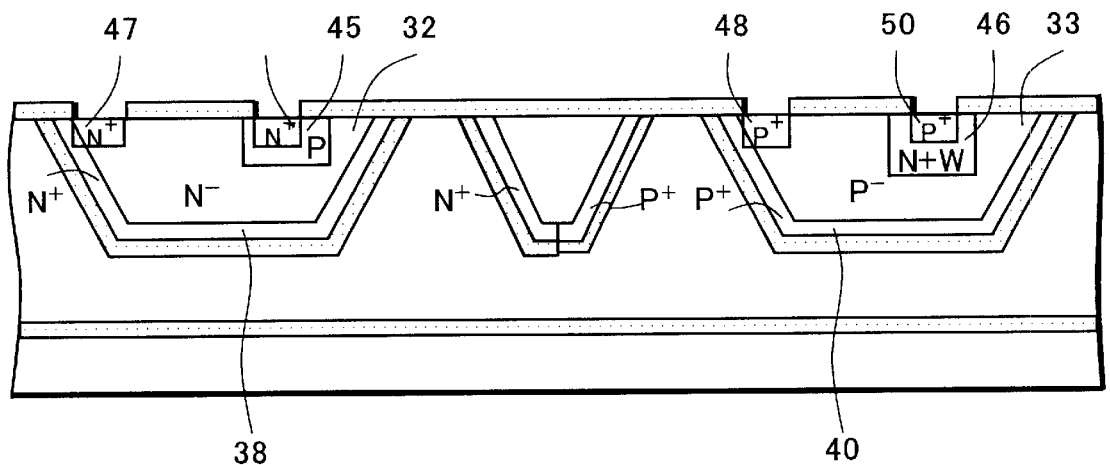
FIG. 13 is a sectional view for explaining a method of manufacturing the semiconductor integrated circuit device according to the first embodiment of this invention.

Next, as shown in FIG. 13, the surface of the N− type collector region 32 and P− type collector region 33 are thermally oxidized to form an oxide film. The oxide film is photo-etched to provide a selective mask. Arsenic (As) is ion-implanted and diffused in the N− type collector region 32 to provide an N+ diffused region 47 serving as an collector taking-out region, and boron (B) is ion-implanted and diffused in the P− type collector region 33 to provide a P+ type diffused region 48 serving as a collector taking-out region. Simultaneously, an N+ type diffused region 49 is formed as an emitter region in the P type diffused region 45 to make an NPN transistor 21. A P+ type diffused region 50 is formed as an emitter region in the N+ type well region 46 to make a PNP transistor 22.

In this step, since the N+ type buried layer 38 and P+ type buried layer 40 have been formed to extend to the surface along the slope of each of the etched V-grooves, the N+ type collector taking-out region 47 and P+ collector taking-out region 48 can be coupled with the N+ type buried layer 38 and the P+ type buried layer 40 in a short diffusion time, respectively. Further, even if there is a misalignment of the masks for the N+ type collector taking-out region 47 and the P+ type collector taking-out region 48, since the N+ type buried layer 38 and P+ type buried layer 40 have been formed to extend to the surface along the slope of each of the etched V-grooves, both can be easily coupled with each other by adjustment of a diffusion time. In this way, the N+ type collector layer 47 and the P+ type collector taking-out region 48 are coupled with the N+ buried layer 38 and the P+ type buried layer 40, respectively to constitute a structure with reduced collector resistance.

Thereafter, an oxide film is deposited on the entire surface, and aluminum is deposited from above the oxide film with openings where electrodes are to be formed, thereby forming electrodes 51. Thus, the semiconductor integrated circuit device as shown in FIG. 1 is formed.

In the embodiment described above, the structure with four epitaxial layers stacked was explained. However, the number of stages of the epitaxial layers may vary according to a using purpose. In this case also, the same effect as the semiconductor integrated circuit device according to the first embodiment can be obtained.

Referring to FIGS. 15–28, an explanation will be given of the second embodiment of this invention.

Figure 15:
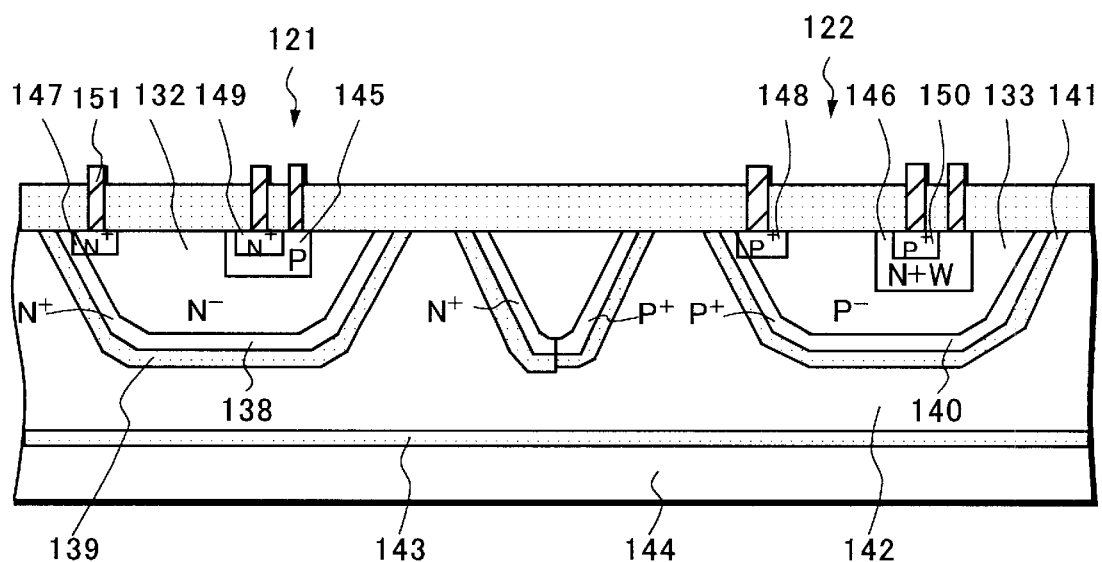
FIG. 15 is a sectional view for explaining a method of manufacturing the semiconductor integrated circuit device according to a second embodiment of this invention.

FIG. 15 is a sectional view of an IC according to this invention in which a high voltage NPN transistor 121 and a high voltage PNP transistor 122 are formed through poly-Si 142 as dielectric-isolated complementary bipolar transistors according to the second embodiment.

The IC structure according to the second embodiment is different from that according to the first embodiment in that the corner of each of the N− type collector region 132, P− type collector region 133, dummy island region 134, etc. is removed. The remaining structure is the same in the first and the second embodiment. The feature and effect of the first embodiment applies in the second embodiment. Therefore, the structure according to the second embodiment should be referred to the explanation of the first embodiment, and not explained here.

Referring to FIG. 16–FIG. 28, an explanation will be given of a method of manufacturing the semiconductor integrated circuit device as shown in FIG. 15.

Figure 16:
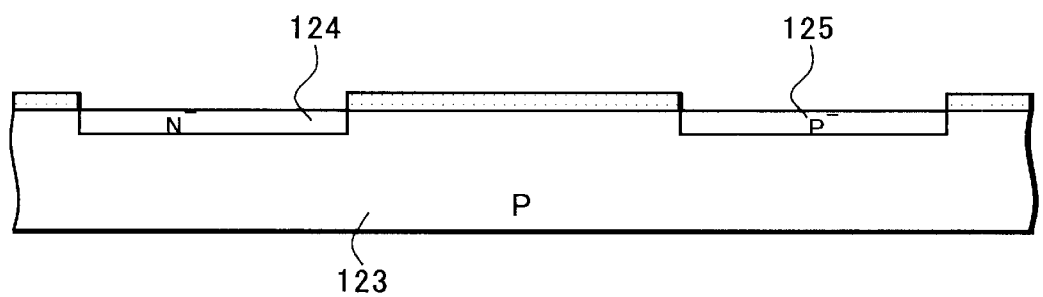
FIG. 16 is a sectional view for explaining a method of manufacturing the semiconductor integrated circuit device according to the second embodiment of this invention.

First, as seen from FIG. 16, a P type monocrystal Si substrate 123 having a thickness of about 650 μm is prepared. The surface of the substrate 123 is thermally oxidized to form an oxide film. The oxide film is photo-etched to provide a selective mask. Phosphorous (P) which forms an N⁻ type first buried layer 124 and boron (B) which forms a P⁻ type first buried layer 125 are ion-implanted and diffused in the surface of the substrate 123.

Figure 17:
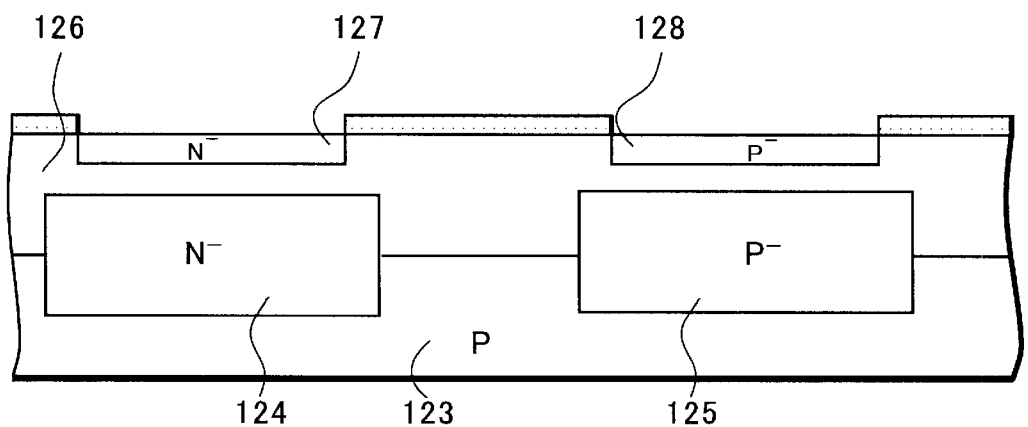
FIG. 17 is a sectional view for explaining a method of manufacturing the semiconductor integrated circuit device according to the second embodiment of this invention.

Next, as shown in FIG. 17, after the oxide film used as the selective film has been entirely removed, the substrate 123 placed on a susceptor of an epitaxial growth apparatus is subjected to a high temperature of about 1140° C. by lamp heating, and $SiH_2Cl_2$ gas and $H_2$ gas are introduced into a reactive tube. An N or N⁻ first epitaxial layer 126 having a thickness of 18–22 μm is grown. The surface of the first epitaxial layer 126 is thermally oxidized to form an oxide film. The oxide film is photo-etched to provide a selective film. Phosphorous (P) which forms an N⁻ type second buried layer 127 and boron (B) which forms a P⁻ type second buried layer 128 are ion-implanted and diffused in the surface of the first epitaxial layer 126.

Figure 18:
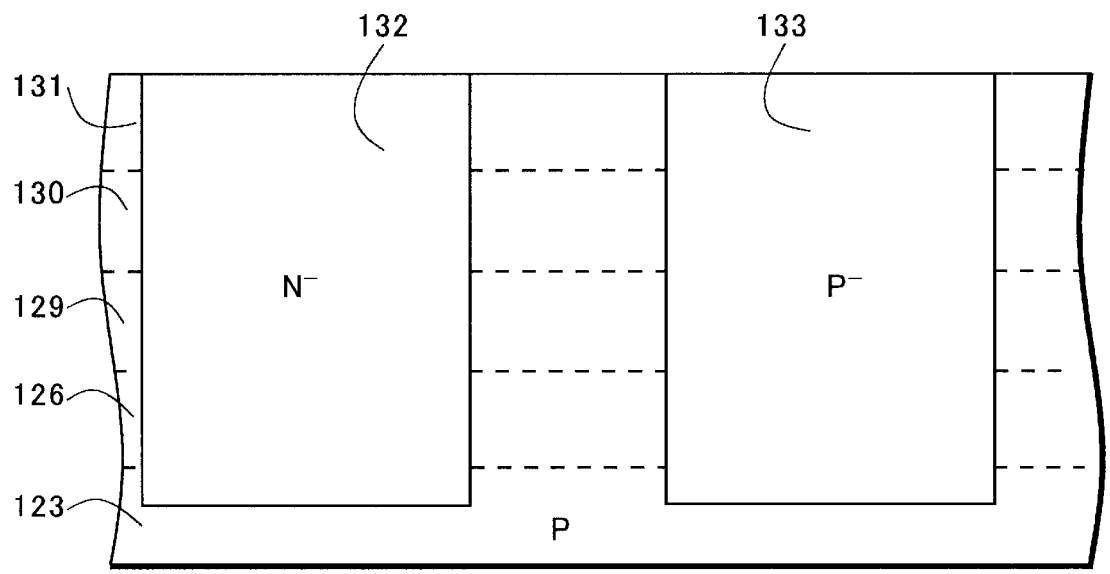
FIG. 18 is a sectional view for explaining a method of manufacturing the semiconductor integrated circuit device according to the second embodiment of this invention.

Next, as shown in FIG. 18, after the oxide film used as the selective film has been entirely removed, the substrate 123 placed on the susceptor of the epitaxial growth apparatus is subjected to a high temperature of about 1140° C. by lamp heating, and $SiH_2Cl_2$ gas and $H_2$ gas are introduced into a reactive tube. An N or N⁻ second epitaxial layer 129 having a thickness of 18–22 μm is grown. Simultaneously, the N⁻ type first and second buried layers 124 and 127 and the P⁻ type first and second buried layers 125 and 128 are coupled with each other by diffusion. After the second epitaxial layer 129 has been formed on the first epitaxial layer 126, a third epitaxial layer 130 and a fourth epitaxial layer 131 are successively formed. In this case, as described above, as regards each epitaxial layer, an N⁻ type buried layer and P⁻ type buried layer are formed by ion-implantation. These buried layers are coupled with each other by diffusion at a high temperature of 1250° C. for about 16 hours. As a result, an N⁻ type collector region 132 of an NPN transistor 121 and a P⁻ type collector region 133 of a PNP transistor 122 are formed.

Now it should be noted that phosphorous (P) is used as N type impurities and boron (B) is used as P type impurities because the impurities having a high diffusing speed assures the coupling the buried layers for a short heat treating time. Namely, this intends to form a flat profile in a short time in the N type impurity region and P type impurity region.

This invention is also characterized in that the regions where the NPN transistor 121 and PNP transistor 122 are to be formed can be formed simultaneously on the substrate 123.

Figure 19:
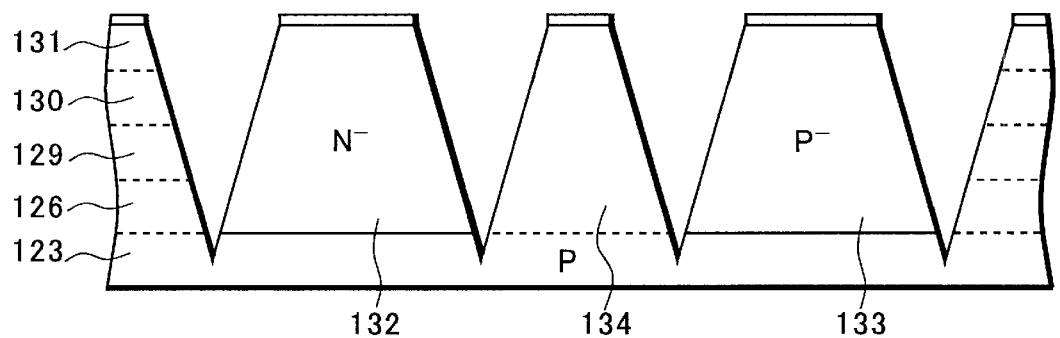
FIG. 19 is a sectional view for explaining a method of manufacturing the semiconductor integrated circuit device according to the second embodiment of this invention.

Next, as shown in FIG. 19, the surface of the fourth epitaxial layer 131 is thermally oxidized to provide an oxide film. The oxide film is photo-etched to form a selective mask. In this case, in order to reduce the interference between the NPN transistor 121 and the PNP transistor 122 formed adjacently in a single chip and suppress the creation of a parasitic transistor, element isolation must be made between the N⁻ type collector region 132 where the NPN transistor 121 is formed and the P⁻ type collector region 133 where the PNP transistor 122 is formed. In view of the known photolithography used in the subsequent self-alignment step, a dummy island region 134 is formed between the N⁻ type collector region 132 and P⁻ type collector region 133. The first epitaxial layer 126, second epitaxial layer 129, third epitaxial layer 130, fourth epitaxial layer 131 and the substrate 123 are etched more deep than the diffused depth of the N⁻ type first buried layer 124 and the P⁻ type first buried layer 125. Thus, V grooves for element isolation are formed.

Figure 20:
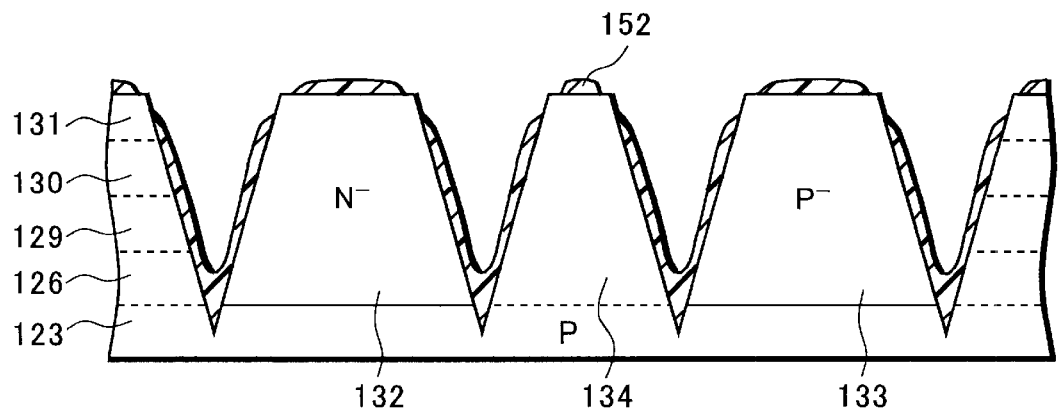
FIG. 20 is a sectional view for explaining a method of manufacturing the semiconductor integrated circuit device according to the second embodiment of this invention.

Next, as shown in FIG. 20, after the oxide film used as the selective film has been entirely removed, photoresist 152 is deposited on the surface. At this time, the dropped photoresist 152 will be deposited with the aid of the centrifugal force when the silicon wafer is rotated. However, this step is stopped at the time when the photoresist 152 is not deposited on the corner of each of the N⁻ type collector region 132, P⁻ type collector region 133, dummy island region 134, etc. where the photoresist 152 is difficult to be deposited.

Figure 21:
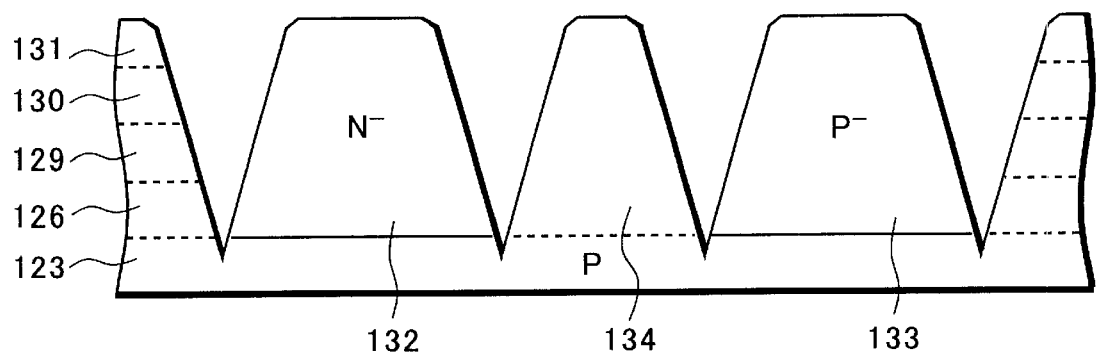
FIG. 21 is a sectional view for explaining a method of manufacturing the semiconductor integrated circuit device according to the second embodiment of this invention.

Next, as shown in FIG. 21, the corner of each of the N⁻ type collector region 132, P⁻ type collector region 133, dummy island region 134, etc. where the photoresist 152 is not deposited is removed by silicon etching. Thereafter, the photoresist 152 used as the selective mask is entirely removed. The etching is executed in the manner of plasma etching at room temperature using $CHF_3$ gas or $CF_4$ gas.

Since the corner of each of the N⁻ type collector region 132, P⁻ type collector region 133, dummy island region 134 is removed in this step, the film thickness can be easily adjusted when the photoresist 152 is deposited on the portion having a V-shape groove structure in the subsequent step. Namely, a structure in which the step of depositing the photoresist can be easily executed is obtained.

Concretely, as described above, the dropped photoresist 152 deposited with the aid of the centrifugal force when the silicon wafer is rotated. At this time, generally, the photoresist will be deposited in the inside of the etched V-groove and the top end of each of the N⁻ type collector region 132, P⁻ type collector region 133 and dummy island region 134, whereas the photoresist 152 is difficult to be deposited on the corner, and even if it is deposited, it is thinner than the other areas. However, since the corner is removed in this step, the photoresist 152 can be deposited more easily. Thus, the deposited film of the photoresist 152 at the corner of each of the N⁻ type collector region 132, P⁻ type collector region 133, dummy island region 134, etc. can have great accuracy.

Figure 22:
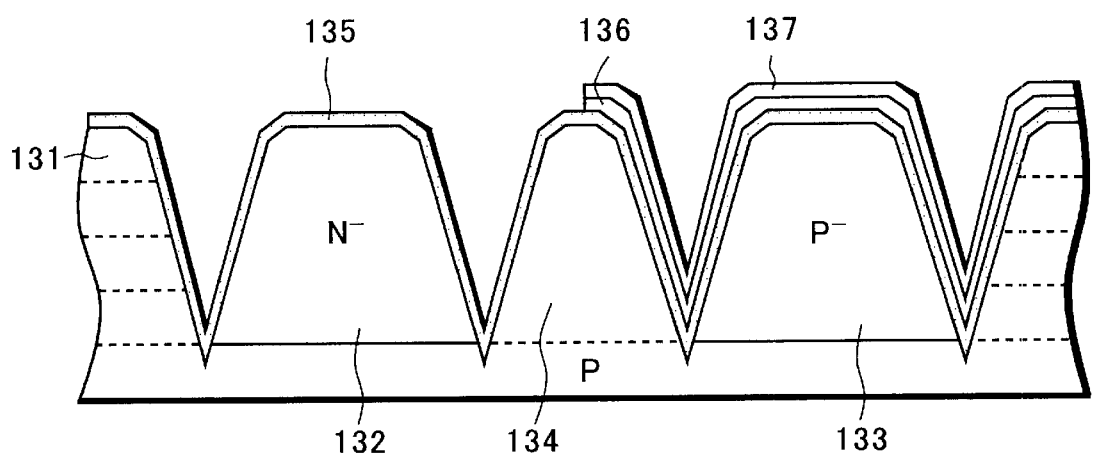
FIG. 22 is a sectional view for explaining a method of manufacturing the semiconductor integrated circuit device according to the second embodiment of this invention.

Next, as shown in FIG. 22, for example, a silicon oxide film 135 having a thickness of 400–500 Å is deposited on the entire surface. Further, a silicon nitride film 136 is deposited on the entire surface. In order to deposit an N⁺ type buried layer 138 on the surface of the N⁻ type collector region 132, photoresist (not shown) is deposited on the entire surface, and by known photolithography, the other silicon nitride film 136 and photoresist 137 than those on the P⁻ type collector region 133 and dummy island region 134 are removed.

Figure 23:
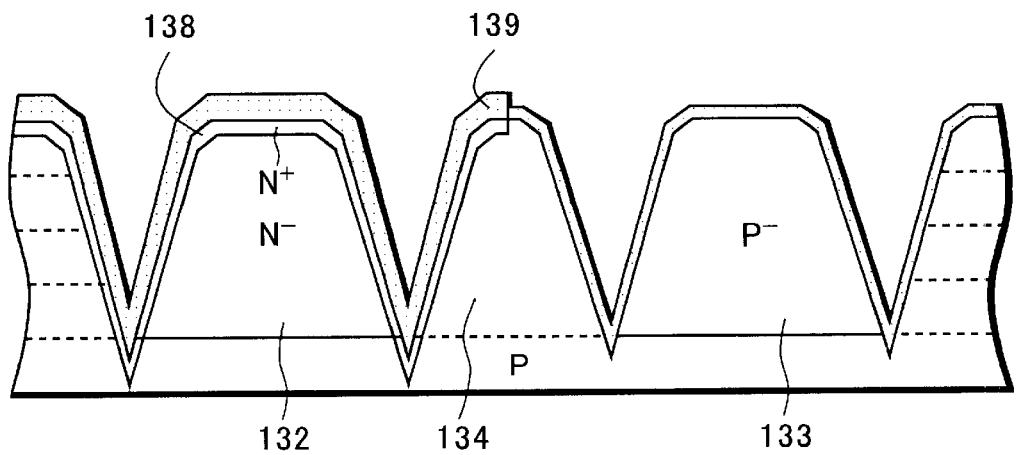
FIG. 23 is a sectional view for explaining a method of manufacturing the semiconductor integrated circuit device according to the second embodiment of this invention.

As shown in FIG. 23, in order to form the N⁺ type buried layer 138 on the periphery of the N⁻ type collector region 132, using the patterned silicon nitride film 136 as a selective mask, arsenic (As) is ion-implanted at an accelerating voltage of 40 keV and dose of $3.0 \times 10^{15}/cm^2$. After the photoresist has been removed, the ion-implanted arsenic is diffused so that the N⁺ type buried layer 138 is formed on the periphery of the N⁻ type collector region 132. At this time, using the silicon nitride film 136 as an oxidation resistant mask, the silicon oxide film is also selectively oxidized to form a LOCOS oxide film 139 having a thickness of about 0.3–0.4 μm. Thereafter, the silicon nitride film 136 used as the selective film is entirely removed.

Figure 24:
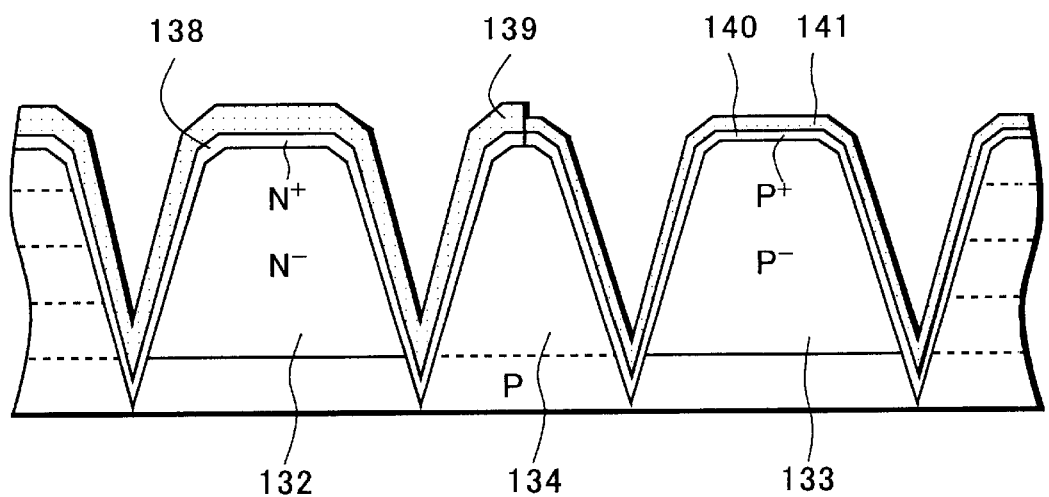
FIG. 24 is a sectional view for explaining a method of manufacturing the semiconductor integrated circuit device according to the second embodiment of this invention.

Next, as shown in FIG. 24, in order to a P⁺ type buried layer 140 on the periphery of the P⁻ type collector region 133, e.g. boron (B) is ion-implanted at an accelerating voltage of 40 keV and dose of $3.0 \times 10^{15}/cm^2$. In this case, because the LOCOS oxide film 139 serves as a mask, the boron is not ion-implanted in the N⁻ type collector region 132.

Next, the ion-implanted boron (B) is diffused to form the P⁺ type buried layer 140 on the periphery of the P⁻ type collector region 133. In this case, provision of the LOCOS oxide film is not required on the P⁻ type collector region 133. Therefore, as seen, the LOCOS oxide film 139 and oxide film 141 remains as they constitute a level difference. The N⁺ type buried layer 138 and the P⁺ type buried layer 140 are brought into contact with each other on the dummy island region 134. However, since no semiconductor layer is formed on the dummy island region and the NPN transistor 121 and the PNP transistor 122 are element-isolated, no problem is presented.

Figure 25:
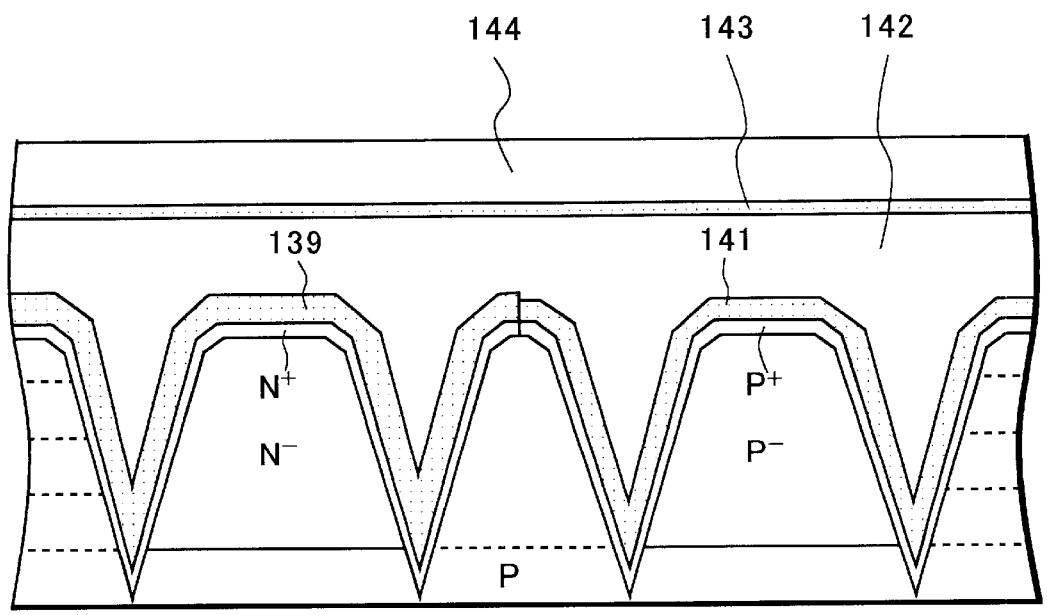
FIG. 25 is a sectional view for explaining a method of manufacturing the semiconductor integrated circuit device according to the second embodiment of this invention.

Next, as shown in FIG. 25, poly-Si 142 is deposited with CVD on the silicon oxide films 139 and 141 at a high temperature of 1240° C. for about one hour so that it has a thickness of about 150 μm. Thereafter, the poly-Si 142 is flattened by polishing so as to have a thickness of at least about 30 μm. A wafer covered with an oxide film 143 prepared separately, which serves as a supporting substrate 144, is bonded onto the surface of the poly-Si 142. The composite is heat-treated at a temperature of 1100–1200° C. for about two hours so that the supporting substrate 144 can be surely bonded to the surface of the poly-Si 142. Incidentally, it should be noted that the supporting substrate 144 may not particularly a conductive material as long as it can endure the subsequent polishing step.

Figure 26:
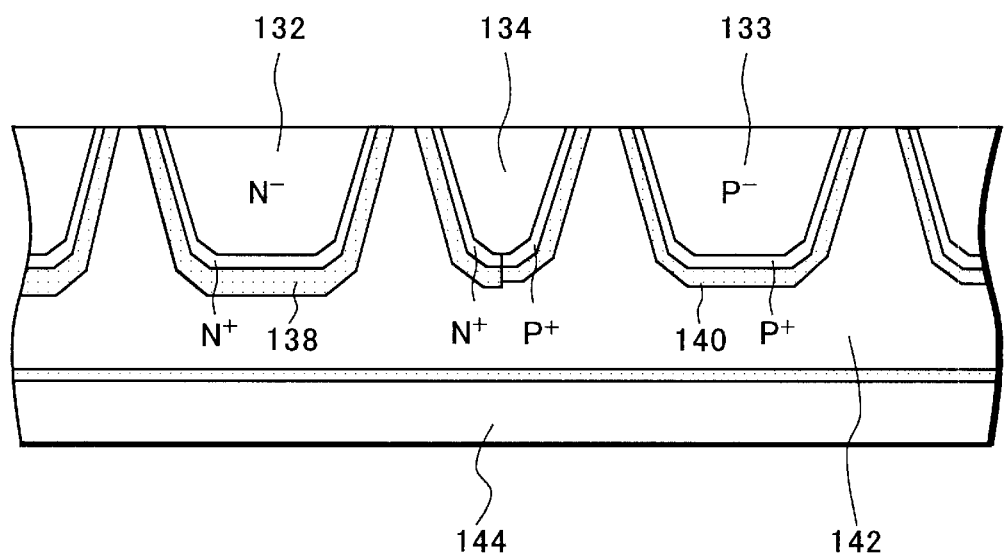
FIG. 26 is a sectional view for explaining a method of manufacturing the semiconductor integrated circuit device according to the second embodiment of this invention.

Next, as shown in FIG. 26, the substrate is turned upside down so that the monocrystal Si substrate 123 constitutes an upper surface and the supporting substrate 144 constitutes a bottom surface. The Si substrate 123 is polished by a thickness of about 580 μm from its surface until the N⁻ type collector region 132 and the P⁻ type collector region 133 are exposed. In this case, the N⁻ type collector region 132, P⁻ type collector region 133 and dummy island region 134 are separated from one another through the poly-Si 142. In this step, the N⁻ type collector region 132 and P⁻ type collector region 133 are formed to have a thickness of about 60–80 μm.

Figure 27:
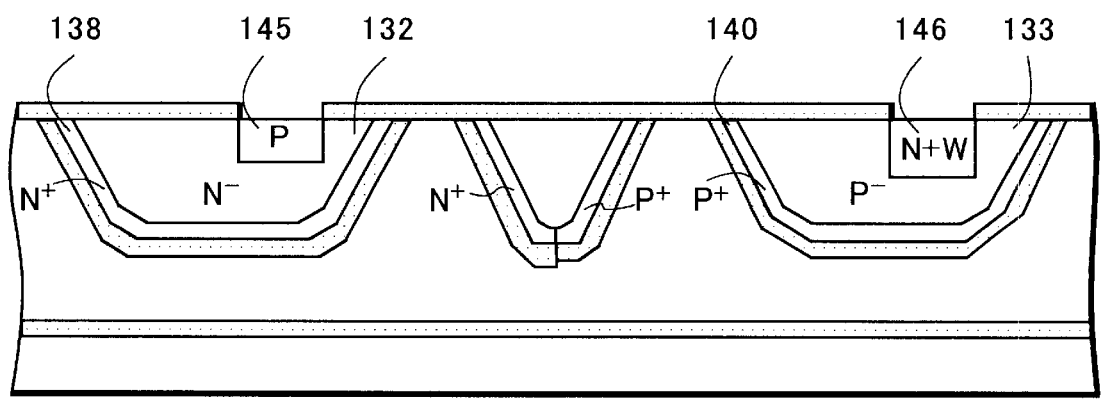
FIG. 27 is a sectional view for explaining a method of manufacturing the semiconductor integrated circuit device according to the second embodiment of this invention.

I o Next, as shown in FIG. 27, a P type diffused region 145 is formed as a base region in the N⁻ type collector region 132, and a N⁺ type well region 146 is formed as a base region in the P⁻ type collector region 133.

Figure 28:
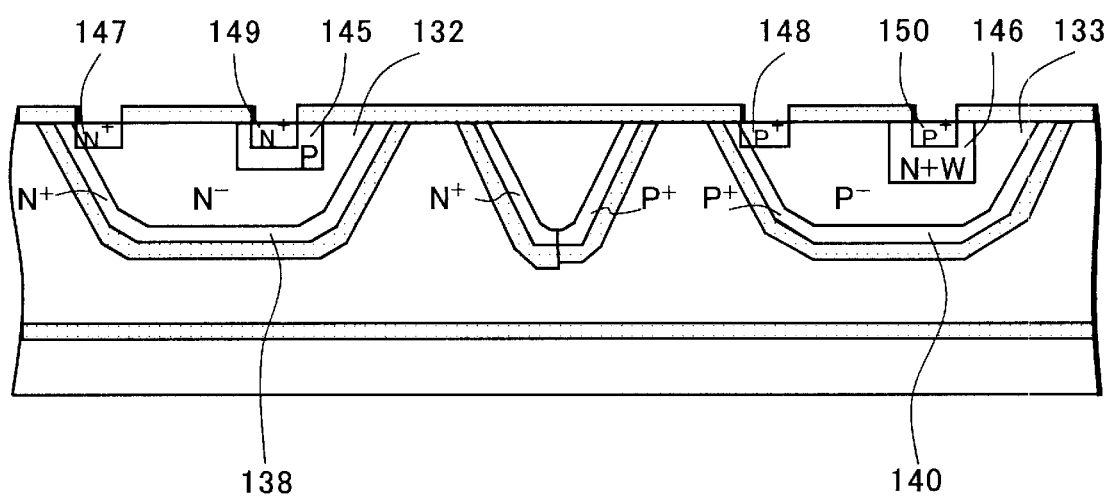
FIG. 28 is a sectional view for explaining a method of manufacturing the semiconductor integrated circuit device according to the second embodiment of this invention.
Figure 29:
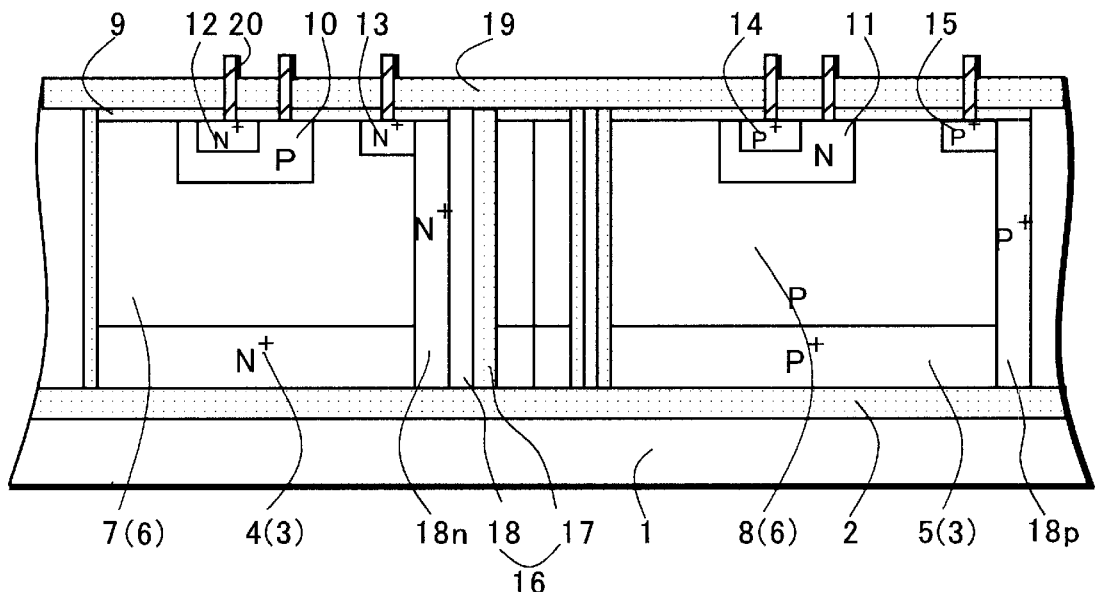
FIG. 29 is a sectional view for explaining a conventional semiconductor integrated circuit device.
Figure 30:
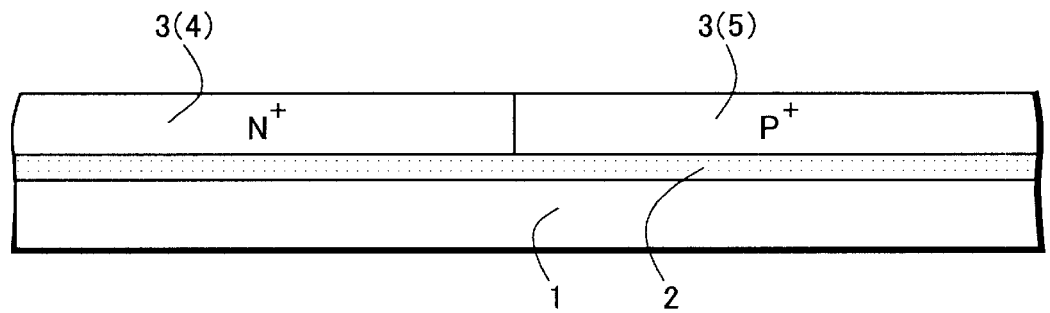
FIG. 30 is a sectional view for explaining a method of manufacturing the conventional semiconductor integrated circuit device.
Figure 31:
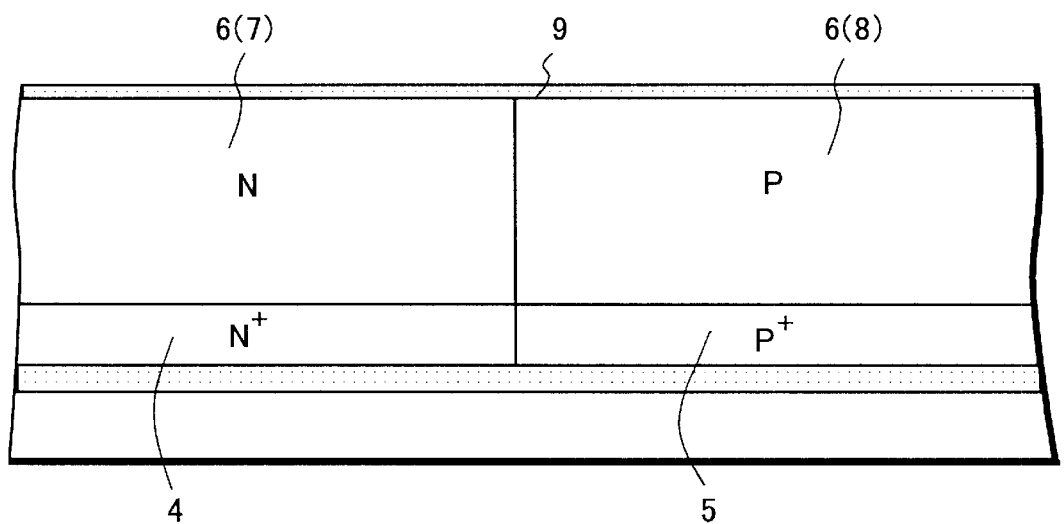
FIG. 31 is a sectional view for explaining a method of manufacturing the conventional semiconductor integrated circuit device.
Figure 32:
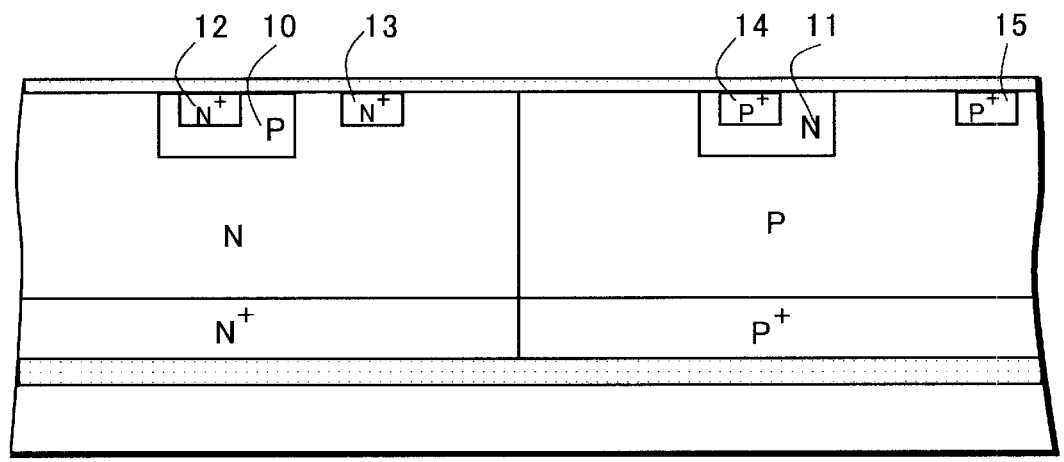
FIG. 32 is a sectional view for explaining a method of manufacturing the conventional semiconductor integrated circuit device.
Figure 33:
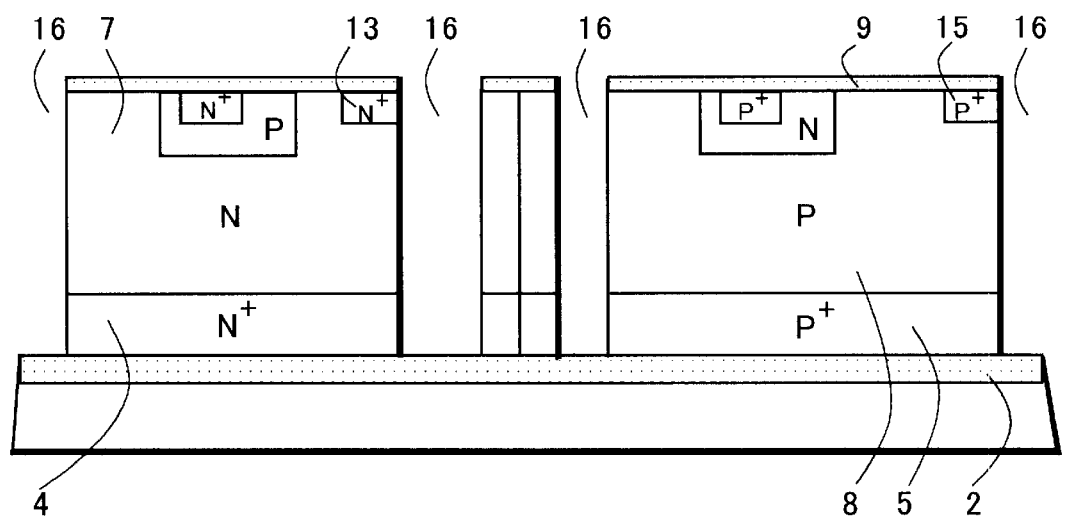
FIG. 33 is a sectional view for explaining a method of manufacturing the conventional semiconductor integrated circuit device.
Figure 34:
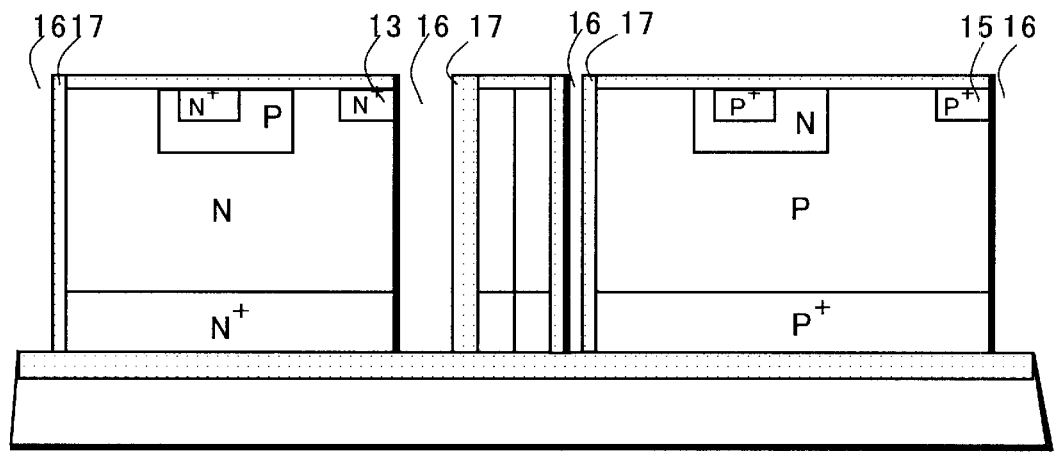
FIG. 34 is a sectional view for explaining a method of manufacturing the conventional semiconductor integrated circuit device.
Figure 35:
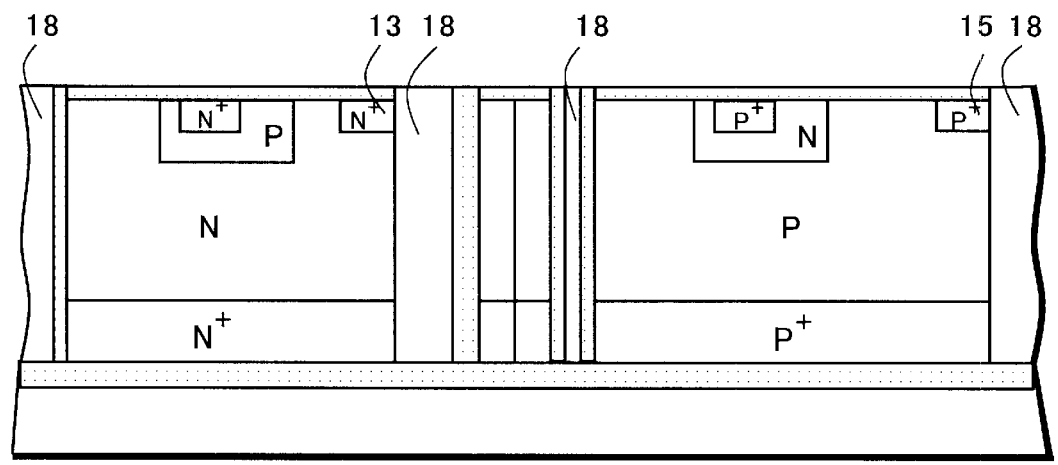
FIG. 35 is a sectional view for explaining a method of manufacturing the conventional semiconductor integrated circuit device.
Figure 36:
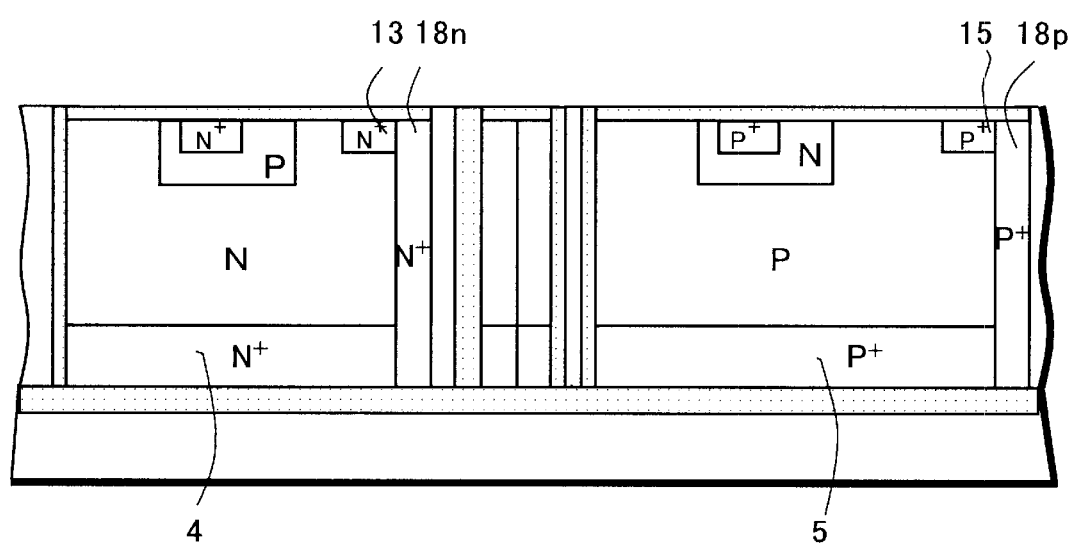
FIG. 36 is a sectional view for explaining a method of manufacturing the conventional semiconductor integrated circuit device.

Next, as shown in FIG. 28, the surface of the N⁻ type collector region 132 and P⁻ type collector region 133 are thermally oxidized to form an oxide film. The oxide film is photo-etched to provide a selective mask. Arsenic (As) is ion-implanted and diffused in the N⁻ type collector region 132 to provide an N⁺ diffused region 147 serving as a collector taking-out region, and boron (B) is ion-implanted and diffused in the P⁻ type collector region 133 to provide a P⁺ type diffused region 148 serving as a collector taking-out region. Simultaneously, an N⁺ type diffused region 149 is formed as an emitter region in the P type diffused region 145 to make an NPN transistor 121. A P⁺ type diffused region 150 is formed as an emitter region in the N⁺ type well region 146 to make a PNP transistor 122.

In this step, since the N⁺ type buried layer 138 and P⁺ type buried layer 140 have been formed to extend to the surface along the slope of each of the etched V-grooves, the N⁺ type collector taking-out region 147 and P⁺ collector taking-out region 148 can be coupled with the N⁺ type buried layer 138 and the P⁺ type buried layer 140 in a short diffusion time, respectively. Further, even if there is a misalignment of the masks for the N⁺ type collector taking-out region 147 and the P⁺ type collector taking-out region 148, since the N⁺ type buried layer 138 and P⁺ type buried layer 140 have been formed to extend to the surface along the slope of each of the etched V-grooves, both can be easily coupled with each other by adjustment of a diffusion time. In this way, the N⁺ type collector layer 147 and the P⁺ type collector taking-out region 148 are coupled with the N⁺ buried layer 138 and the P⁺ type buried layer 140, respectively to constitute a structure with reduced collector resistance.

Thereafter, an oxide film is deposited on the entire surface, and aluminum is deposited from above the oxide film with openings where electrodes are to be formed, thereby forming electrodes 151. Thus, the semiconductor integrated circuit device as shown in FIG. 15 is formed.

In the embodiment described above, the structure with four epitaxial layers stacked was explained. However, the number of stages of the epitaxial layers may vary according to a using purpose. In this case also, the same effect as the semiconductor integrated circuit device according to the second embodiment can be obtained.

In accordance with this invention, in the semiconductor integrated circuit device, a highly-doped buried layer is formed on the periphery of a lightly-doped collector region and coupled with a highly-doped collector taking-out region to form a highly-doped region, thereby reducing the collector resistance and realizing the thick film of the collector. Thus, a high voltage integrated circuit device can be manufactured. Specifically, in order to obtain a collector-emitter voltage Vceo of 250 V or higher, the film thickness of the collector region must be 60 μm or more. This invention can provide such a high voltage device whereas the method of using a trench cannot provide it.

In accordance with the method of manufacturing a semiconductor integrated circuit device, the step of forming a collector region is executed in such a manner that multiple epitaxial layers are stacked, the thick collector region can be realized, thereby implementing the method of manufacturing a high voltage semiconductor integrated circuit device.

In accordance with the method of manufacturing a semiconductor integrated circuit device, in the step of etching the collector region, since it is etched in a V-groove, it can be etched in a plane orientation to the deep position, and dielectric isolation is surely made by the poly-Si, thereby implementing the method of manufacturing the semiconductor integrated circuit device which can reduce influence of the transistors from each other.

In accordance with the method of manufacturing a semiconductor integrated circuit device, in the step of etching the collector region, since it is etched in a V-groove, a slope can be given to the side of the collector region so that the highly-doped buried layer can be formed at a time, thereby implementing the method of manufacturing the semiconductor integrated circuit device with very high productivity.

In accordance with the method of manufacturing a semiconductor integrated circuit device, in a step of forming the collector taking-out region of complementary transistor, the etching the collector region, since it is etched in a V-groove, the highly-doped buried layer can be formed with a slope so that the collector taking-out region with less diffusion can be coupled with the highly-doped buried layer. In addition, the collector taking-out region can be formed in the same step as the emitter region. Thus, the method of manufacturing a semiconductor integrated circuit with very high productivity can be implemented.

In accordance with the method of manufacturing a semiconductor integrated circuit device, in the step of forming the highly-doped buried layer, the self-alignment technique is used so that the photoresist step can be omitted by one step. Thus, the method of manufacturing a semiconductor integrated circuit with very high productivity can be implemented.

In accordance with the method of manufacturing a semiconductor integrated circuit device, the corner of each of the N-type and P-type collector region, dummy region, etc. can be removed by silicon etching. For this reason, in the step of depositing the photoresist film by photolithography, the photoresist film can be deposited on the corner easily and accurately, thereby implementing the method of manufacturing a semiconductor integrated circuit with very high productivity.

In accordance with the method of manufacturing a semiconductor integrated circuit device, in the step of forming the highly-doped buried layer, the self-alignment technique is used so that the photoresist step can be omitted by one step. Thus, the method of manufacturing a semiconductor integrated circuit with very high productivity can be implemented.

What is claimed is:

1. A semiconductor integrated circuit device comprising:
    a supporting substrate;
    an oxide layer disposed on the supporting substrate;
    a polycrystalline semiconductor layer formed on the oxide layer;
    a first island region having one conduction type;
    a second island region which is formed of a burial layer of a lightly-doped impurity diffused layer having an opposite conduction type, said first island region and said second island region being separated from each other by said polycrystalline semiconductor layer;
    a first buried layer of a highly-doped impurity diffused layer having the one conduction type, said first buried layer is formed on the periphery of said first island region;
    a second buried layer of a highly-doped impurity diffused layer having the opposite conduction type, said second buried layer is formed on the periphery of said second island region;
    a first transistor formed in said first island region;
    a second transistor formed in said second island region, said first and second transistors having different conduction types,
    wherein the surfaces of said polycrystalline semiconductor layer and said first and second island regions are made substantially flat.

2. A semiconductor integrated circuit device according to claim 1, wherein said first and said second island regions include a plurality of epitaxially layers, respectively.

3. A semiconductor integrated circuit device according to claim 1, wherein said first and said second island region have a thickness of 5 $\mu$m–100 $\mu$m.

4. A semiconductor integrated circuit device according to claim 1, wherein said first transistor having the one conduction type formed in said first island region is an NPN transistor, and said second transistor having the opposite conduction type formed in said second island region is a vertical PNP transistor.

5. A semiconductor integrated circuit device according to claim 1, wherein the first island region is formed of a burial layer of a lightly doped impurity diffused layer having one conduction type.

6. A semiconductor integrated circuit device according to claim 1, wherein the first island region is formed of epitaxial layers having one conduction type.

7. A semiconductor integrated circuit device comprising:
    a supporting substrate;
    a polycrystalline semiconductor layer formed over said supporting substrate;
    a first island region having one conduction type;
    a second island region which is formed of a burial layer of a lightly-doped impurity diffused layer having an opposite conduction type, said first island region and said second island region being separated from each other by said polycrystalline semiconductor layer;
    a dummy island region disposed between the first and the second island regions;
    a first buried layer of a highly-doped impurity diffused layer having the one conduction type, said first buried layer is formed on the periphery of said first island region;
    a second buried layer of a highly-doped impurity diffused layer having the opposite conduction type, said second buried layer is formed on the periphery of said second island region;
    a first transistor formed in said first island region;
    a second transistor formed in said second island region, said first and second transistors having different conduction types,
    wherein the surfaces of said polycrystalline semiconductor layer and said first and second island regions arc made substantially flat.

8. A semiconductor integrated circuit device according to claim 7, wherein said first and said second island regions include a plurality of epitaxially layers, respectively.

9. A semiconductor integrated circuit device according to claim 7, wherein said first and second island region have a thickness of 5 $\mu$m–100 $\mu$m.

10. A semiconductor integrated circuit device according to claim 7, wherein said first transistor having the one conduction type formed in said first island region is an NPN transistor, and said second island region having the opposite conduction type formed in said second island region is a vertical PNP transistor.

11. A semiconductor integrated circuit device according to claim 7, wherein the first island region is formed of a burial layer of a lightly doped impurity layer having one conduction type.

12. A semiconductor integrated circuit device according to claim 7, wherein the first island region is formed of epitaxial layers having one conduction type.

* * * * *